(12) United States Patent
Katashiba et al.

(10) Patent No.: US 7,283,294 B2
(45) Date of Patent: Oct. 16, 2007

(54) CATADIOPTRIC PROJECTION OPTICAL SYSTEM, EXPOSURE APPARATUS HAVING THE SAME, DEVICE FABRICATION METHOD

(75) Inventors: Yuji Katashiba, Utsunomiya (JP); Chiaki Terasawa, Nasu-gun (JP); Hideki Morishima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 57 days.

(21) Appl. No.: 11/257,785

(22) Filed: Oct. 24, 2005

(65) Prior Publication Data

US 2006/0088320 A1    Apr. 27, 2006

(30) Foreign Application Priority Data

Oct. 25, 2004   (JP)   .............................. 2004-309129

(51) Int. Cl.
*G02B 17/08*  (2006.01)
(52) U.S. Cl. ....................................... 359/363; 359/726
(58) Field of Classification Search ........ 359/362–366, 359/725–733; 355/53, 67
See application file for complete search history.

(56) References Cited

U.S. PATENT DOCUMENTS

| | | | |
|---|---|---|---|
| 4,757,354 A | 7/1988 | Sato et al. | |
| 4,861,148 A | 8/1989 | Sato et al. | |
| 4,953,960 A | 9/1990 | Williamson | |
| 5,220,454 A | 6/1993 | Ichihara et al. | |
| 5,592,329 A | 1/1997 | Ishiyama et al. | |
| 5,650,877 A | 7/1997 | Phillips, Jr. et al. | |
| 5,668,673 A | 9/1997 | Suenaga et al. | |
| 5,691,802 A | 11/1997 | Takahashi | |
| 6,496,306 B1 | 12/2002 | Shafer et al. | |
| 2003/0021040 A1 | 1/2003 | Epple et al. | |
| 2004/0233405 A1* | 11/2004 | Kato et al. ..................... | 355/53 |

FOREIGN PATENT DOCUMENTS

| | | |
|---|---|---|
| JP | 62-210415 | 9/1987 |
| JP | 62-258414 | 11/1987 |
| JP | 2-66510 | 3/1990 |
| JP | 3-282527 | 12/1991 |
| JP | 5-188298 | 7/1993 |
| JP | 6230287 | 8/1994 |
| JP | 8-304705 | 11/1996 |
| JP | 2000-47114 | 2/2000 |
| JP | 2003-43362 | 2/2003 |

* cited by examiner

*Primary Examiner*—Joshua L Pritchett
(74) *Attorney, Agent, or Firm*—Morgan & Finnegan L.L.P.

(57) ABSTRACT

A catadioptric optical system comprising a first imaging optical system including a concave mirror and forming an intermediate image of a first object, said first imaging optical system forming a reciprocating optical system that an incidence light and reflected light pass, a second imaging optical system for forming an image of the intermediate image onto a second object, and a first optical path deflective member, provided between the concave mirror and the intermediate image, for introducing a light from the first imaging optical system to the second imaging optical system, wherein said first optical path deflective member deflects a light in such a direction that a forward path of the first imaging optical system intersects a return path of the first imaging optical system, and wherein said intermediate image is formed without an optical element after a deflection.

5 Claims, 14 Drawing Sheets

CATADIOPTRIC PROJECTION OPTICAL SYSTEM, EXPOSURE APPARATUS HAVING THE SAME, DEVICE FABRICATION METHOD

BACKGROUND OF THE INVENTION

The present invention relates generally to a projection optical system, and more particularly to a catadioptric projection optical system that projects an object, such as a single crystal substrate and a glass plate for a liquid crystal display ("LCD"), using a mirror. The present invention is suitable, for example, an immersion exposure apparatus (an immersion lithography exposure system) for exposing the object through a fluid between the projection optical system and the object.

The photolithography technology for manufacturing fine semiconductor devices, such as semiconductor memory and logic circuits, has conventionally employed a reduction projection exposure apparatus that uses a projection optical system to project a circuit pattern of a reticle (or mask) onto a wafer, etc. A more highly integrated and finer semiconductor device (circuit pattern) requires a projection optical system for a better specification and performance. Generally, a shorter wavelength of the exposure light and a higher numerical aperture ("NA") are effective to improve the resolution. Recently, an optical system with an NA of 1 or higher that utilizes an immersion optical system that fills a space with fluid between a final glass surface (in other words, the lens closet to the wafer) of the projection optical system and the wafer has been proposed, and a higher NA scheme is in progress.

For the exposure light with a short wavelength such as an ArF excimer laser (with a wavelength of approximately 193 nm) and a $F_2$ laser (with a wavelength of approximately 157 nm) for higher resolution, lens materials are limited to quartz and calcium fluoride for reduced transmittance. An optical system that includes only lenses (refracting element) absorbs the large amount of light, and reduces an exposure dose on the wafer, causing a decrease in through put. Moreover, lens's heat absorption and resultant temperature rise disadvantageously fluctuate a focal position, (heat) aberrations, etc. Quartz and calcium fluoride possess similar dispersive powers, and have difficulties in correcting the chromatic aberration. Especially, the lens material can use only calcium fluoride for the exposure wavelength of 157 nm, and correcting the chromatic aberration becomes more difficult. In addition, a lens diameter increases as the NA becomes higher, and causes the increased apparatus cost.

Various proposals that use a mirror (reflecting element) for an optical system have been made to solve the disadvantageous reduced transmittance, difficult corrections to the chromatic aberration and large aperture of the lens. For example, a catadioptric projection optical system that combines a mirror with a lens has been disclosed. See, for example, U.S. Pat. No. 5,650,877 (reference 1), Japanese Patent Applications, Publication Nos. 62-210415 (reference 2), 62-258414 (reference 3), 5-188298 (reference 4), 6-230287 (reference 5), 2-66510 (reference 6), 3-282527 (reference 7), 8-304705 (reference 8), 2000-47114 (reference 9), and 2003-43362 (reference 10).

A projection optical system that includes a reflective optical system for a shorter exposure wavelength and a higher NA needs to correct the chromatic aberration, to maintain a large enough imaging area on an image surface, and to secure a sufficient working distance on the image side with a simple structure. The large enough imaging area on the image surface is advantageous to a scanning exposure apparatus to maintain the throughput, and reduce exposure fluctuations. The sufficient image-side working distance is desirable for an apparatus's auto-focusing system, a wafer-stage's transport system, and the like. The simple structure would simplify a barrel and the like, and facilitate the assembly production.

The optical system disclosed in the reference 1 arranges a Mangin mirror and a refractor in an optical system, and exposes a reticle image onto a wafer. Disadvantageously, this optical system blocks light on a pupil's central part for all the angles of view to be used (hollow illumination), and cannot enlarge an exposure area. An attempt to enlarge the exposure area results in the undesirable expansion of the light blockage on the pupil's central part. In addition, since a refractive surface of the Mangin mirror forms the light splitting surface that halves the light intensity when ever the light passes through its surface, and reduces the light intensity down to about 10% on the image surface (wafer surface).

The references 2 and 3 apply Cassegrain and Schwarzschild mirror systems, and each propose an optical system that has an opening at the center of the mirror to create a hollow illumination to the pupil and to image only the pupil's periphery. However, the hollow illumination on the pupil deteriorates the imaging performance. An attempt to lessen the hollow illumination to the pupil inevitably increases the power of the mirror and enlarges an angle incident upon the mirror. A high NA causes a mirror's diameter to grow remarkably.

According to the optical system disclosed in the references 4 and 5, the deflected optical path complicates an apparatus's configuration. A high NA is structurally difficult because the concave mirror is responsible for most powers in the optical units for imaging an intermediate image onto a final image. Since a lens system located between the concave mirror and the image surface is a reduction system and the magnification has a positive sign, the image-side working distance cannot be sufficiently secured. Since an optical path needs to be split, it is structurally difficult to secure an imaging area width. The large optical system is not suitable for foot-printing.

The references 6 and 7 first split an optical path using by the beam-splitter, and complicate the structure of a lens barrel. They need the beam-splitter with a large diameter and if the beam-splitter is a prism type, a loss of the light intensity is large due to its thickness. A higher NA needs a larger diameter and increases a loss of the light intensity. Use of a flat-plate beam splitter is also problematic, because it causes astigmatism and coma even with axial light. In addition to asymmetrical aberrations due to heat absorptions and aberrations due to characteristic changes on the beam splitting surface, accurate productions of the beam splitter is difficult.

The optical system disclosed in the references 8 to 10 propose a twice-imaging catadioptric optical system for forming an intermediate image once. It includes a first imaging optical system that has a reciprocating optical system (double-pass optical system) which includes concave mirrors to form an intermediate image of a first object (e.g., a reticle), and a second imaging optical system that forms the intermediate image onto a surface of a second object (e.g., a wafer). The optical system of the reference 8 arranges a first plane mirror near the intermediate image for deflecting an optical axis and light near the intermediate image. The deflected optical axis is made approximately parallel to a reticle stage and is deflected once again by a second plane mirror, or an image is formed onto a second object without a second plane mirror. In the optical system of the reference 9, a positive lens refracts light from a first object (e.g., a reticle), and a first plane mirror deflects the optical axis. A second plane mirror in a first imaging optical system again deflects the light reflected by a reciprocating optical system that includes a concave mirror to form an intermediate image. The intermediate image is projected onto a second object (e.g., a wafer) with a second imaging optical system. However, a magnification of the first imaging optical system serves as a reduction system more (corresponding to a paraxial magnification |β1| of about 0.625 of the first imaging optical system). Therefore, the first intermediate image enlarges the NA of the first intermediate image for an object-side NA in the first object by the reduction magnification. As a result, an incident angle range upon the plane mirror increases, and a higher NA scheme as in the immersion etc. encounters a serious problem. In other words, the first imaging optical system that controls a reduction magnification, a higher NA excessively increases the incident angle range upon the plane mirror, and a reflection film on the plane mirror causes a large difference in reflected light's intensity between the p-polarized light and s-polarized light. As a result, a critical dimension ("CD") difference undesirably increases in an effective image plane. In the optical system of the reference 10, a first plane mirror deflects light from a first object (e.g., a reticle), a second plane mirror deflects the light reflected by a reciprocating optical system that includes a concave mirror, and a positive lens forms an intermediate image. The intermediate image is projected onto a second object (e.g., a wafer) with a second imaging optical system. Thus, a distance from the second plane mirror to the intermediate image becomes long by forming the intermediate image via the positive lens, and a light diameter on the second plane mirror becomes large. Therefore, an influence to a quality of the image projected onto the image surface by a few flaws exited on the reflection surface can be disregarded. Moreover, an asymmetry contribution to an imaging error such as coma generated by heating to the lens is compensated by arranging the positive lens in before and after the middle image and symmetry. However, it is difficult to control reflection film properties because the incident angle upon the plane mirror is large. In other words, the light intensity difference between the p-polarized light and s-polarized light increases by the influence of the reflection film on the plane mirror, and the CD difference in the effective image plane will be increased.

On the other hand, the optical system shown in FIG. 4 of the reference 10 reflects light from a first object (e.g., a reticle) by a reciprocating optical system that includes a concave mirror, deflects light on a return path optical path of the light returned from the concave mirror of the reciprocating optical system in a direction that intersects with light on a forward path optical path of the light traveled to the concave mirror by a first plane mirror, and forms an intermediate image via a lens. The optical system deflects light from the intermediate image by a second plane mirror, and projects onto a second object (e.g., a wafer). However, the optical system only changes an arrangement of the plane mirror, without changing numerical example for the structure of the first embodiment of the reference 10, and the reference 10 does not advert about the influence to the reflection film by the incident angle upon the plane mirror. Moreover, all embodiments have a structure that arranges the positive lens between the first plane mirror and the intermediate image. Therefore, an incident angle range upon the second plane mirror increases by higher NA of the intermediate image, and a design of the reflection film on the mirror and control of forming film are difficult. An arrangement of the optical system becomes difficult by a physical interference between a marginal ray on the forward path of the reciprocating optical system and the lens according a higher NA. In addition, a distance from the first plane mirror to the intermediate image need to long, the light diameter on the first plane mirror becomes large, and light on the forward path is limited. Therefore, it is difficult to secure an enough effective imaging area. A higher first object point to secure the effective imaging area becomes a wide angle, and correcting the aberration becomes difficult. Moreover the chromatic coma aberration by the lens between the first plane mirror and the intermediate image becomes in the same direction as the chromatic coma aberration generated in the second imaging optical system. Therefore, the chromatic coma aberration increases, and it is difficult to obtain a desired imaging performance according a higher NA.

BRIEF SUMMARY OF THE INVENTION

Accordingly, the present invention is directed to a catadioptric optical system, an exposure apparatus having the same, and device fabrication method, that can simplify a mechanical structure, minimize an influence of a reflection film on a plane mirror, reduce a physical interference between light and a lens according a higher NA and a chromatic coma aberration generated by a lens between a plane mirror and an intermediate image, and achieve a superior image performance.

A catadioptric optical system according to one aspect of the present invention includes a first imaging optical system including a concave mirror and forming an intermediate image of a first object, said first imaging optical system forming a reciprocating optical system that an incidence light and reflected light pass, a second imaging optical system for forming an image of the intermediate image onto a second object, and a first optical path deflective member, provided between the concave mirror and the intermediate image, for introducing a light from the first imaging optical system to the second imaging optical system, wherein said first optical path deflective member deflects a light in such a direction that a forward path of the first imaging optical system intersects a return path of the first imaging optical system, wherein said intermediate image is formed without an optical element after a deflection, and wherein the image of the first object is projected onto the second object through an intermediate image formation.

Other objects and further features of the present invention will become readily apparent from the following description of the preferred embodiments with reference to the accompanying drawings.

DETAILED DESCRIPTION OF THE PREFERRED EMBODIMENTS

Figure 1:
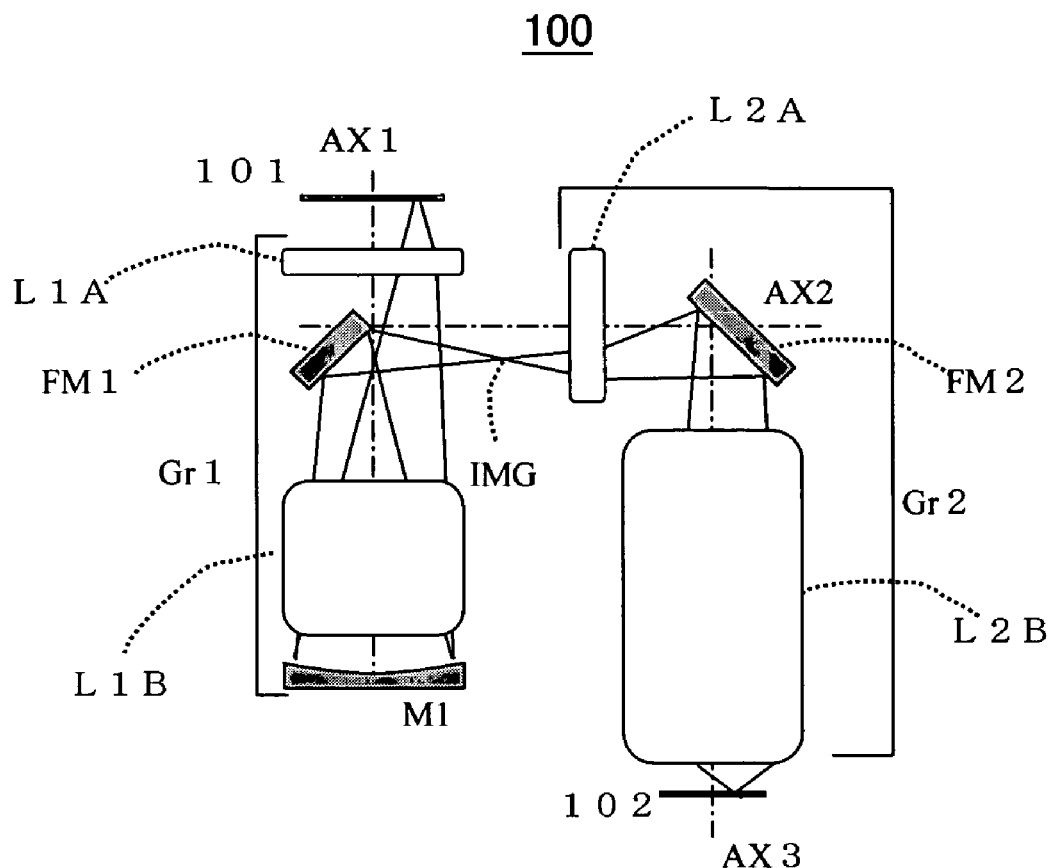
FIG. 1 is a schematic sectional view of a catadioptric projection optical system of one aspect according to the present invention.

A description will now be given of a catadioptric projection optical system of one aspect according to the present invention, with reference to the accompanying drawings. In each figure, the same reference numeral denotes the same element. Therefore, a duplicate description will be omitted. Here, FIG. 1 is a schematic sectional view of a catadioptric projection optical system 100 of the present invention.

Referring to FIG. 1, 101 denotes a first object (e.g., a reticle) and 102 denotes a second object (e.g., a wafer). AX1 to AX3 are optical axes of optical systems. An effective area from the first object 101 to an imaging is a off-axial ring field area without on-axial. The catadioptical projection optical system 100 is an optical system that does not block light on a pupil's central part (hollow illumination) as shown in FIG. 1.

The catadioptical projection optical system 100 include, in order of light traveling from the first object 101 side, a first imaging optical system Gr1 and a second imaging optical system Gr2.

The first imaging optical system Gr1 includes a lens unit L1A, a concave mirror M1 arranged near a pupil position, and a reciprocating optical system (part) L1B, and forms a real image of the first object 101 (a first intermediate image IMG1). A first deflective reflector FM1 is inclined to the optical axis AX1 at 45°, deflects light from the first imaging optical system Gr1 and introduces to the second imaging optical system Gr2. A second deflective reflector FM2 is inclined to the optical axis AX2 at 45 and deflects light from the intermediate image IMG. Thereby, it is possible to arrange the first object 101 and the second object 102 in parallel. In FIG. 1, the catadioptric projection optical system 100 is constructed so that the optical axis AX1 and the optical axis AX2 become parallel. Moreover, the optical axis AX2 and the optical axis AX1, and the optical axis AX2 and the optical axis AX3 are arranged orthogonally.

The second imaging optical system Gr2 includes a lens unit L2A and a lens unit L2B. The second imaging optical system Gr2 has a pupil in the lens unit L2B and forms an image of the intermediate image IMG onto the second object 102 at a predetermined magnification.

The first imaging optical system's concave mirror M1 and lens correct chromatic aberrations and a positive Petzval sum generated by the second imaging optical system Gr2.

In the catadioptric projection optical system 100 of the present invention, the first deflective reflector FM1 deflects, as shown in FIG. 1, light on a return path of the first imaging optical system Gr1 that is a reciprocating optical system. Concretely, the first deflective reflector FM1 deflects light on the return path of the first imaging optical system Gr1 in a direction that intersects with light on a forward path. Therefore, an incident angle of principal ray that incident upon the first deflective reflector FM1 can be controlled at 45° or smaller. Moreover, an incident angle of principal ray that incident upon the second deflective reflector FM2 can be controlled similarly by arranging the lens unit (field lens) L2A that has a positive power between the first deflective reflector FM1 and the second deflective reflector FM2. Therefore, a reflected light's intensity difference between p-polarized light and s-polarized light generated by an influence to a reflection film on a plane mirror can be controlled to small.

The catadioptric projection optical system 100 reflects light by the first deflective reflector FM1 and forms an intermediate image IMG without through the lens. Therefore, the catadioptric projection optical system 100 can avoid interference between a marginal ray of the first imaging optical system Gr1 and the lens unit L2A, and a structure of an optical system becomes easy for a higher NA.

The catadioptric projection optical system 100 does not arrange the lens between the first deflective reflector FM1 and the second deflective reflector FM2, but arranges the lens between the intermediate image IMG and the second deflective reflector FM2. Therefore, the catadioptric projection optical system 100 can obtain effects that compensate a coma generated in the lens near the second object 102 that becomes a problem to a higher NA.

In the catadioptric projection optical system 100, preferably, the following conditional expression, where β1 is a paraxial imaging magnification of the first imaging optical system Gr1, and NAO is a numerical aperture of the light at the first object 101 side.

$$|\beta 1/NAO| > 3.8 \qquad (1)$$

The conditional expression (1) defines a ratio between the paraxial imaging magnification of the first imaging optical system Gr1 and the numerical aperture NAO at the first object 101 side. If a value is lower than the lower limit in the conditional expression (1), the imaging magnification β1 of the first imaging optical system Gr1 becomes an excessively small reduction magnification and a principal ray angle and an incident angle range of the light entering the first deflective reflector FM1 become excessively large. The excessively large incident angle range undesirably complicates control over reflection film properties of a plane mirror. A transmittance distribution on a pupil changes and the imaging performance deteriorates.

In the ratio between the paraxial imaging magnification of the first imaging optical system Gr1 and the numerical aperture of the light NAO at the first object 101 side, more preferably, the following conditional expression is met.

$$6.2 > |\beta 1/NAO| > 5.0 \qquad (2)$$

If a value is exceeds the upper limit in the conditional expression (2), the imaging magnification β1 of the first imaging optical system Gr1 becomes an excessively large reduction magnification, a light diameter on the first deflective reflector FM1 becomes excessively large, and light on the forward path is limited. Therefore, it is difficult to secure an enough effective imaging area.

On the other hand, if a value is satisfied the lower limit of the conditional expression (2), the principal ray angle and the incident angle range of the light entering the first deflective reflector FM1 can controlled to small. Therefore, it is easy to control reflection film properties of the plane mirror.

In the catadioptric projection optical system 100, preferably, the following conditional expression, where $\beta 1$ is a paraxial imaging magnification of the first imaging optical system Gr1, $\beta f$ is a paraxial imaging magnification of the lens unit L2A arranged between the intermediate image IMG and the second deflective reflector FM2, and NAO is a numerical aperture of the light at the first object 101 side.

$$6.80 < |\beta 1 \cdot \beta f / NAO| < 10.60 \quad (3)$$

If a value is lower than the lower limit in the conditional expression (3), a imaging magnification from the first imaging optical system Gr1 to the lens unit L2A becomes an excessively small reduction magnification and a principal ray angle and an incident angle range of the light entering the second deflective reflector FM2 become excessively large. The excessively large incident angle range undesirably complicates control over reflection film properties of a plane mirror. A transmittance distribution on a pupil changes and the imaging performance deteriorates.

If a value exceeds the upper limit in the conditional expression (3), the imaging magnification from the first imaging optical system Gr1 to the lens unit L2A becomes an excessively large reduction magnification, and it is necessary to become the imaging magnification of second imaging optical system Gr2 to excessively small. Therefore, it is necessary to become the power to large because the pupil moves the first object 101 side, and the Petzval sum deteriorates.

Moreover, in the catadioptric projection optical system 100, preferably, the following conditional expression, where a is a distance parallel to the optical axis AX2 between the intermediate image IMG and a first surface of an optical element closest to the intermediate image IMG among the lens unit L2A, and b is a distance along the optical axis AX2 and the optical axis AX3 for the light from the intermediate image IMG to the second object 102 surface via the second imaging optical system Gr2.

$$0.0005 < a/b < 0.105 \quad (4)$$

If a value is lower than the lower limit of the conditional expression (4), the first imaging optical system Gr1 and the lens unit L2A close, it is difficult to secure a space, and results in complicating a mechanical structure. The correcting effect of the chromatic coma aberration decreases.

On the other hand, if a value exceeds the upper limit of the conditional expression (4), an effective diameter of lens of the lens unit L2A becomes excessively large. The excessively large effective diameter of lens undesirably complicates manufacture of high quality lens materials, and the apparatus becomes big.

In addition, in the catadioptric projection optical system 100, preferably, the following conditional expression, where c is a distance along the optical axis AX1, the optical axis AX2 and the optical axis AX3 for the light from the first surface 101 to the second object 102 surface via the optical elements.

$$0.47 < b/c < 0.58 \quad (5)$$

If a value is lower than the lower limit of the conditional expression (5), a space between the first imaging optical system Gr1 and the second imaging optical system Gr2 becomes narrow, and results in complicating a mechanical structure. On the other hand, if a value exceeds the upper limit of the conditional expression (5), an effective diameter of lens of the second imaging optical system Gr2 becomes excessively large. The excessively large effective diameter of lens undesirably complicates manufacture of high quality lens materials, and the apparatus becomes big.

A sign of an angle of a pupil paraxial ray may be inverted at before or after the lens unit L2A arranged between the intermediate image IMG and the second deflective reflector FM2. If the sign is not inverted, the incident angle of the principal ray entering the second deflective reflector FM2 becomes excessively large. The excessively large incident angle undesirably complicates control over reflection film properties of the plane mirror.

An angle between a principal ray of light incident upon the first deflective reflector FM1 and a reflection surface of the first deflective reflector FM1 may be 43° or smaller. Because a convergent light incident upon the first deflective reflector FM1, the marginal ray is incident upon the first deflective reflector FM1 by a larger angle than the principal ray. The incident angle may be small from viewpoint of the reflection film on the plane mirror. Therefore, the incident angle of off-axis principal ray becomes 43° or smaller to the first deflective reflector FM1 inclined to the optical axis AX1 at 45°.

The incident angle range may be small to control reflection film properties formed on the plane mirror. Therefore, the incident angle range of ray entering the first deflective reflector FM1 is preferably 35° or smaller, more preferably 30° or smaller.

In the catadioptric projection optical system 100, all positive power optical elements arranged between the first deflective reflector FM1 and the second deflective reflector FM2 have an expansion magnification. In other words, the positive power optical element only arranges between the intermediate image IMG as the real image and the second deflective reflector FM2. Thereby, the correcting effect of the chromatic coma aberration can be obtained, and the incident angle and the incident angle range of light entering the second deflective reflector FM2 decrease. Therefore, it is easy to control reflection film properties of the plane mirror.

In the catadioptric projection optical system 100, preferably, the following conditional expression is met, where $\beta 1$ is the paraxial imaging magnification of the first imaging optical system Gr1.

$$|\beta 1| > 1.0 \quad (6)$$

If a value is lower than the lower limit of the conditional expression (6), the imaging magnification $\beta 1$ of the first imaging optical system Gr1 becomes an excessively small reduction magnification and the incident angle range of the light entering the first deflective reflector FM1 become excessively large. The excessively large incident angle range undesirably complicates control over reflection film properties of a plane mirror.

In the paraxial imaging magnification $\beta 1$ of the first imaging optical system Gr1, more preferably, the following conditional expression is met.

$$1.25 > \beta 1 \quad (7)$$

If the conditional expression (7) is not met, a light diameter on the first deflective reflector FM1 becomes excessively large, and light on the forward path is limited. Therefore, it is difficult to secure an enough effective imaging area.

In FIG. 1, it is not necessary for the optical axis AX1 and the optical axis AX2 to be arranged orthogonally. For example, if the first object 101 and the second object 102 are arranged in parallel, unless an interference of the lens and reflection member etc. occurs, the optical axis AX1 and the optical axis AX2 may have an arbitrary angle.

An angle between the optical axis AX1 and the reflection surface of the first deflective reflector FM1 is preferably 45° or smaller. If the angle is not 45° or smaller, the incident angle of ray entering the first deflective reflector FM1 becomes large, and it is difficult to control reflection film properties of the plane mirror. Moreover, it is difficult to secure a space near the first object 101, and results in complicating a mechanical structure.

A shortest distance parallel to the optical axis AX2 between an optical element of the first imaging optical system Gr1 or marginal ray and a first surface of a lens closest to the first imaging optical system Gr1 among the lens unit L2A is preferably 30 mm or more. If the shortest distance is not 30 mm or more, a physical interference with light and lens occurs, and results in complicating a mechanical structure.

The upper limit of the shortest distance parallel to the optical axis AX2 between the optical element of the first imaging optical system Gr1 or marginal ray and the first surface of the lens closest the first imaging optical system Gr1 among the lens unit L2A is more preferably 160 mm or less. If the shortest distance exceeds 160 mm, the intermediate image IMG and the lens unit L2A excessively separates from each other, and the effective diameter of the lens unit L2A becomes excessively large. The excessively large effective diameter of lens undesirably complicates manufacture of high quality lens materials, and the apparatus becomes big.

If the intermediate image IMG and the lens unit L2A closes from each other, it is necessary to separate the first deflective reflector FM1 and the intermediate image IMG from each other. Therefore, the light diameter on the first deflective reflector FM1 becomes excessively large, and light on the forward path is limited. Thereby, it is difficult to secure an enough effective imaging area. A higher object point of the first object 101 to secure the effective imaging area is not desirable because correcting the aberration becomes difficult.

The catadioptric projection optical system 100 includes, in the present embodiment, deflective reflectors (the first deflective reflector FM1 and the second deflective reflector FM2). Concretely, the catadioptric projection optical system 100 has one deflective reflector respectively in the optical path of the first imaging optical system Gr1 and the optical path of the second imaging optical system Gr2. Here, when the first object 101 and the second object 102 are arranged in abbreviation parallel, the first deflective reflector FM1 and the second deflective reflector FM2 are arranged to form a relative angle difference of 90° between their reflective surfaces. When the first object 101 and the second object 102 do not need to be arranged in abbreviation parallel, the second deflective reflector FM2 does not need to arrange.

For the catadioptric projection optical system 100 of the present invention, the first imaging optical system Gr1 includes the reciprocating optical system (part) L1B. However, the reciprocating optical system L1B has a negative refractive power and includes at least one lens having a negative refractive power. At least one of those lenses having a negative refractive power preferably have its concave surface oriented toward the first object 101. This reciprocating optical system L1B preferably has at least one lens having an aspheric surface. If the reciprocating optical system L1B does not have the lens having the aspheric surface, a plurality of lenses are used for the reciprocating optical system L1B to share the power. Of course, even when the lens having the aspheric surface is used, constructing the reciprocating optical system L1B with a plurality of lenses can better control introduction of aberrations at the reciprocating optical system part. The concave mirror M1 may have an aspheric surface.

The first deflective reflector FM1 and the second deflective reflector FM2 include deflective mirrors. The shape of the deflective mirror may be a shape of a flat plate or other shape (for example, part of a cubic shape). The first deflective reflector FM1 and the second deflective reflector FM2 may also be a mirror that utilizes backside reflection of glass. The light splitter may also be used for the first deflective reflector FM1 and the second deflective reflector FM2, in which case, an off-axial beam can be used from the on-axis.

An aperture stop (not shown) is preferably arranged in the second imaging optical system Gr2. The aperture stop may also be arranged in combination or singly around where a principal ray of the first imaging optical system Gr1 intersects the optical axis AX1.

In FIG. 1, the optical axis AX1 and the optical axis AX2, and the optical axis AX2 and the optical axis AX3 are arranged orthogonal to each other, but they need not necessarily be orthogonal. As mentioned above, the first deflective reflector FM1 and the second deflective reflector FM2 preferably are arranged such that their mutual reflection surfaces have an angular difference of 90°. This is because if the first deflective reflector FM1 and the second deflective reflector FM2 are arranged such that they have a relative angular difference of 90', the first object 101 and the second object 102 can be arranged in parallel. However, if there is no need to arrange the first object 101 and the second object 102 in parallel, the first deflective reflector FM1 and the second deflective reflector FM2 need not have relative angular difference of 90°, and thus, may have the arbitrary angle.

In the catadioptric projection optical system 100, preferably, at least the image-surface side is made telecentric to reduce fluctuations of the magnification when a surface of the second object 102 varies in the optical-axis direction.

Preferably, the catadioptric projection optical system 100 provides the first imaging optical system Gr1 with the concave mirror M1 and a refractor, the second imaging optical system Gr2 with a refractor. The catadioptric system when used for the final imaging optical system causes interfere between a concave mirror and the light, and complicates a configuration of an optical system with a high NA. If a catadioptric system is not adopted as a subsystem in the total optical system, chromatic aberrations are hard to be corrected. Moreover, if a reflective system is used for the first imaging optical system Gr1, chromatic aberrations are hard to be corrected.

The catadioptric projection optical system 100 may include an aberration correction mechanism that corrects aberrations. The aberration correction mechanism is possible to include a mechanism in the first imaging optical system Gr1 that moves a lens in an optical axis direction and/or in a direction vertical to an optical axis, or in other directions (to decenter a lens). A similar aberration correction mechanism may be included in the second imaging optical system Gr2. In addition, a mechanism for deforming the concave mirror M1 may be included to correct aberrations.

The catadioptric projection optical system 100 is suitable an immersion structure that fills a fluid between the second object 102 surface and the final lens surface of the optical system. However, the space between the second object 102 surface and the final lens surface may be air.

A field stop may be provided near the intermediate image IMG. When a diffraction optical element is used for the optical system, and the second object 102 surface and its neighborhood use the above immersion structure, a view-field limiting stop provided to a final glass surface on the optical system and a neighboring field stop (e.g., between the final glass surface and the surface of the second object 102) will prevent flare light etc., which are and are not generated from the diffraction optical element, from arriving at the second object 102 surface. The second object 102 surface may have an immersion structure without employing a diffraction optical element in the optical system.

In building an immersion optical system, whether or not a diffraction optical element is present, an axial interval between the final surface of the optical system and the surface of the second object 102 is preferably 5 mm or less, more preferably 2 mm or less, to minimize influences by fluid properties etc. on the imaging performance of the optical system.

Although the catadioptric projection optical system 100 has, in the instant embodiment, a magnification of ¼, it is not limited to this and may be /1;5 or /1;6.

The catadioptric projection optical system 100 uses an off-axial image point of the first object, in a certain range off the optical axis. At that time, a rectangular or arc slit area on the first object surface, not inclusive of the optical axis, becomes an exposure area.

The catadioptric projection optical system 100 deflects light on the return path of the reciprocating optical system in a direction that intersects light on the forward path by the first deflective reflector FM1. Therefore, the deterioration of the reflection film properties resulting from the incident angle range upon the deflective reflector that becomes the problem according a shorter wavelength and a higher NA can be prevented. The catadioptric projection optical system 100 reflects light by the first deflective reflector FM1 and forms the intermediate image IMG without through the lens. Therefore, the incident angle range upon the second deflective reflector FM2 decreases, and it is easy to control the reflection film properties. Moreover, the catadioptric projection optical system 100 avoids interference between light near the intermediate image and the lens, control the chromatic coma aberration, and can be obtain the predetermined imaging performance. However, the catadioptric projection optical system 100 is not limited to the structure shown in FIG. 1.

The catadioptric projection optical system 100 of the present invention is especially effective with a high NA of 0.8 or higher, particularly, 0.85 or higher. The catadioptric projection optical system 100 of the present invention is suitable for the exposure apparatus that uses a light with shorten wavelength, preferably a light with a wavelength of 200 nm or less, as exposure light, and is especially effective for the wavelength such as ArF excimer laser and $F_2$ laser that requires for to the immersion.

Hereafter, a description will be given of a configuration of the catadioptric projection optical system 100.

First Embodiment

Figure 2:
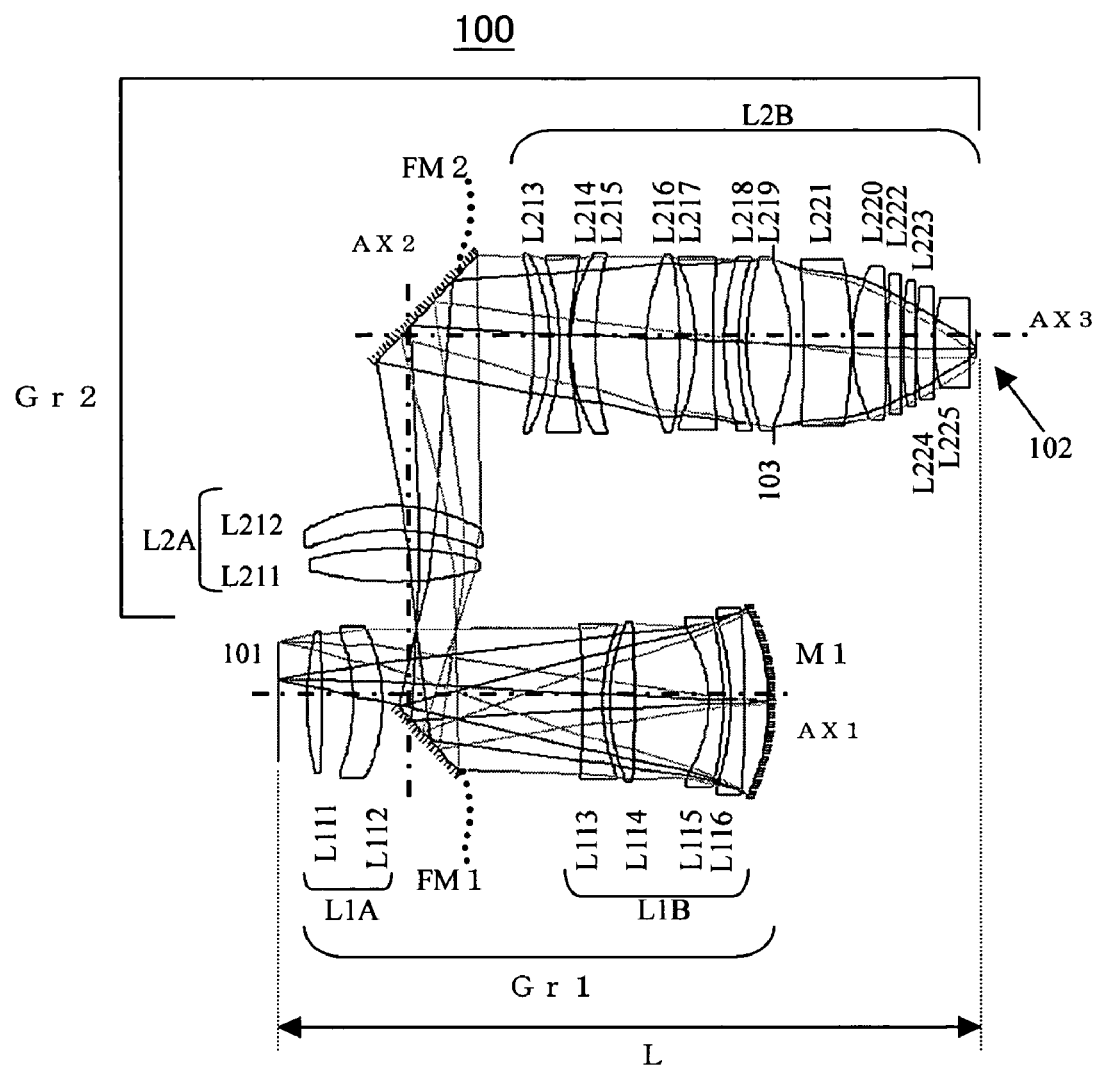
FIG. 2 is an optical-path diagram showing a configuration of the catadioptric projection optical system according to the present invention.

FIG. 2 is an optical-path diagram showing a configuration of the catadioptric projection optical system 100 of the first embodiment. Referring to FIG. 2, the catadioptric projection optical system 100 includes, in order from the first object 101 side, a first imaging optical system Gr1 and a second imaging optical system Gr2.

The first imaging optical system Gr1 includes, in order from the first object 101 side, a lens unit L1A having a positive refractive power, a reciprocating optical system (part) L1B having a negative refractive power, and a concave mirror M1.

The lens unit L1A includes, along the light traveling direction from the side of the first object 101, an aspheric positive lens L111 and a positive lens L112. The aspheric positive lens L111 has an approximately planoconvex form that has a convex surface oriented toward the first object 101 side. The positive lens L112 has a meniscus form that has a convex surface oriented toward a side opposite to the first object 101 side.

The reciprocating optical system L1B includes an aspheric negative lens L113, a positive lens L114, an aspheric negative lens L115, a negative lens L116, and a concave mirror M1. The aspheric negative lens L113 has an approximately planoconcave form that has a concave surface oriented toward a side opposite to the first object 101 side. The positive lens L114 has an approximately planoconvex form that has a convex surface oriented toward the first object 101 side. The aspheric negative lens L115 has a meniscus form that has a concave mirror oriented toward the first object 101 side. The negative lens L116 has a meniscus form that has a concave surface oriented toward the first object 101 side. The concave mirror M1 has a concave form that has a concave surface oriented toward the first object 101 side.

The light from the first object 101 passes through the lens unit L1A, enters the reciprocating optical system L1B, is reflected at the concave mirror M1, and reenters the reciprocating optical system L1B. Then, a deflective reflector FM1 deflects the optical axis AX1 to the optical axis AX2 by 90°. The light is also reflected, and an intermediate image IMG is formed.

The first deflective reflector FM1 is arranged between the first imaging optical system Gr1 and the second imaging optical system Gr2. Preferably, as in the instant embodiment, the first deflective reflector FM1 is arranged between the intermediate image IMG and the reciprocating optical system L1B. In the instant embodiment, the first deflective reflector FM1 uses a flat mirror.

The second imaging optical system Gr2 includes a lens unit L2A having a positive refractive power and a lens unit L2B having a positive refractive power.

The lens unit L2A includes, along the light traveling direction from the side of the first imaging optical system Gr1, a biconvex aspheric positive lens L211 and a meniscus aspheric positive lens L212 with its convex surface oriented toward a side opposite to the intermediate image IMG side.

The lens unit L2B includes a positive lens L213, a negative lens L214, an aspheric positive lens L215, an aspheric positive lens L216, a negative lens L217, an aspheric positive lens L218, an aspheric positive lens L219, an aperture stop 103, a positive lens L220, a positive lens L221, an aspheric positive lens L222, a positive lens L223, an aspheric positive lens L224, and an aspheric positive lens L225. The positive lens L213 has a meniscus form that has a convex surface oriented toward the second object 102 side.

The negative lens L214 has a biconcave form. The aspheric positive lens L215 has an approximately planoconvex form that has a convex surface oriented toward a side opposite to the second object 102 side. The aspheric positive lens L216 has an approximately planoconvex form that has a convex surface oriented toward a side opposite to the second object 102 side. The negative lens L217 has an approximately planoconcave form that has a concave surface oriented toward a side opposite to the second object 102 side. The aspheric positive lens L218 has a meniscus form that has a convex surface oriented toward a side opposite to the second object 102 side. The aspheric positive lens L219 has a biconvex form. The positive lens L220 has a meniscus form that has a convex surface oriented toward the second object 102 side. The positive lens L221 has an approximately planoconvex form that has a convex surface oriented toward a side opposite to the second object 102 side. The aspheric positive lens L222 has an approximately planoconvex form that has a convex surface oriented toward a side opposite to the second object 102 side. The positive lens L223 has an approximately planoconvex form that has a convex surface oriented toward a side opposite to the second object 102 side. The aspheric positive lens L224 has an approximately planoconvex form that has a convex surface oriented toward a side opposite to the second object 102 side. The aspheric positive lens L225 has a planoconvex form that has a plane surface oriented toward the second object 102 side.

The second deflective reflector FM2 is arranged between the lens unit L2A and the lens unit L2B of the second imaging optical system Gr2. The present embodiment makes the second deflective reflector FM2 of a plane mirror for deflecting the light reflected from the first deflective reflector FM1 in a predetermined direction.

The second imaging optical system Gr2 of the instant embodiment includes, but is not limited to, the lens unit L2A having positive refractive power and the lens unit L2B having positive refractive power. For example, the lens unit L2B can have a lens unit with a negative refractive power or another structure.

The aperture stop 103 is arranged between the aspheric positive lens L219 and the positive lens L220.

The catadioptric projection optical system 100 of the first embodiment uses a projection magnification of ¼, a reference wavelength of 157 nm, and calcium fluoride as a glass material. An image-side numerical aperture is NA=0.80. An object-image distance (the first object 101 surface to the second object 102 surface) is L=997.84 mm. An aberration-corrected object point in a range of about 7.50 to 20.25 mm secures a rectangular exposure area of at least 26 mm long and 8 mm wide.

Figure 3:
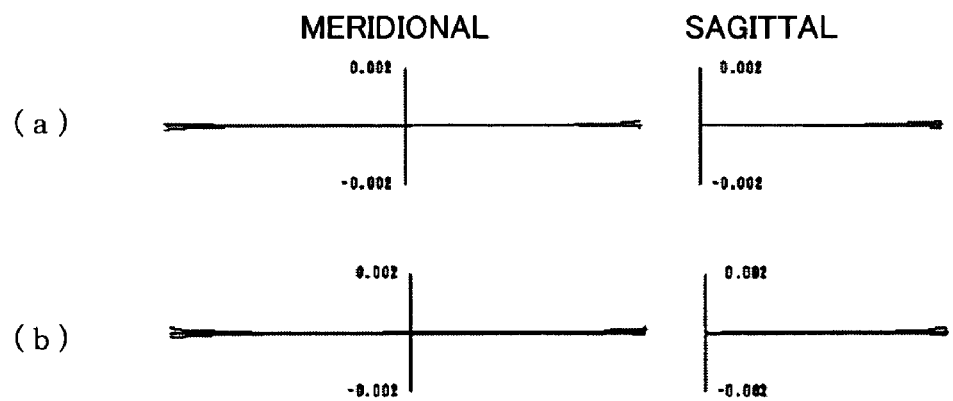
FIG. 3 is an aberrational diagram of the catadioptric projection optical system shown in FIG. 2.

FIG. 3 shows a lateral aberration diagram of the catadioptric projection optical system 100 of the first embodiment. FIG. 3 shows a wavelength with a reference wavelength of 157.6 nm±0.6 pm. Understandably, monochrome and chromatic aberrations are satisfactorily corrected. FIG. 3A shows a lateral aberration diagram for light from an off-axis area that has an image point of 7.5 mm in the second object 102. On the other hand, FIG. 3B shows a lateral aberration diagram for light from an off-axis area that has an image point of 20.25 mm in the second object 102. While the instant embodiment uses only calcium fluoride as a glass material, other glass materials such as barium calcium fluoride, magnesium calcium fluoride, and the like may be used in combination or singularly.

The following Table 1 shows the specification of the numerical example of the catadioptric projection optical system 100 of the first embodiment. "i" in the table is a surface number along a direction of light traveling from the first object 101. "ri" is a radius of curvature for each surface corresponding to a surface number. "di" is a surface spacing of each surface. A shape of an aspheric surface is given by the following equation:

$$X = (H^2/4)/(1+((1-(1+k)\cdot(H/ri)^2))^{1/2}) + AH^4 + BH^6 + CH^8 + DH^{10} + EH^{12} + FH^{14} + GH^{16}$$

where X is a displacement in a direction of an optical axis from the lens top, H is a distance from the optical axis, ri is a radius of curvature, k is a conical constant; and A, B, C, D, E, F, and G are aspheric coefficients. A lens glass material $CaF_2$ has a refractive index to a reference wavelength $\lambda = 157.000$ nm is 1.56. The refractive indexes of the wavelengths of +0.6 pm and −0.6 pm for the reference wavelengths are, 1.55999847 and 1.560000153, respectively.

TABLE 1

DISTANCE FROM FIRST OBJECT~FIRST SURFACE: 41.15312 mm

| i | ri | di | LENS MATERIAL | |
|---|---|---|---|---|
| 1 | 395.97465 | 20.22118 | caf2 | |
| 2 | −2898.20269 | 44.71464 | | |
| 3 | −251.61654 | 42.00000 | caf2 | |
| 4 | −231.04782 | 286.07966 | | |
| 5 | −1822.70249 | 28.34838 | caf2 | |
| 6 | 256.11745 | 10.06127 | | |
| 7 | 254.50945 | 35.66908 | caf2 | |
| 8 | −2557.13314 | 103.60600 | | |
| 9 | −180.38280 | 20.31823 | caf2 | |
| 10 | −468.06841 | 10.69468 | | |
| 11 | −339.05921 | 21.00642 | caf2 | |
| 12 | −1135.87333 | 33.83254 | | |
| 13 | −278.56064 | −33.83254 | | M1 |
| 14 | −1135.87333 | −21.00642 | caf2 | |
| 15 | −339.05921 | −10.69468 | | |
| 16 | −468.06841 | −20.31823 | caf2 | |
| 17 | −180.38280 | −103.60600 | | |
| 18 | −2557.13314 | −35.66908 | caf2 | |
| 19 | 254.50945 | −10.06127 | | |
| 20 | 256.11745 | −28.34838 | caf2 | |
| 21 | −1822.70249 | −268.88082 | | |
| 22 | 0.00000 | 162.32865 | | FM1 |
| 23 | 412.14379 | 44.81415 | caf2 | |
| 24 | −514.47810 | 24.63586 | | |
| 25 | −350.11325 | 33.47520 | caf2 | |
| 26 | −254.60012 | 219.66548 | | |
| 27 | 0.00000 | −199.95918 | | FM2 |
| 28 | 514.92997 | −23.66212 | caf2 | |
| 29 | 255.35596 | −13.37135 | | |
| 30 | 338.01319 | −15.04140 | caf2 | |
| 31 | −459.91711 | −1.01570 | | |
| 32 | −258.57016 | −34.83108 | caf2 | |
| 33 | −457.51166 | −71.87340 | | |
| 34 | −223.68365 | −47.54530 | caf2 | |
| 35 | 751.85440 | −22.60074 | | |
| 36 | 268.47191 | −23.38703 | caf2 | |
| 37 | −1165.25792 | −16.20487 | | |
| 38 | −386.40525 | −20.33655 | caf2 | |
| 39 | −466.36508 | −12.77442 | | |
| 40 | −370.27173 | −63.27240 | caf2 | |
| 41 | 232.77226 | 23.91356 | | |
| 42 | 0.00000 | −42.90082 | | APERTURE STOP |
| 43 | 1148.49808 | −68.29475 | caf2 | |
| 44 | 568.06929 | −1.01683 | | |
| 45 | −219.12809 | −49.17786 | caf2 | |
| 46 | 1682.72634 | −1.01683 | | |
| 47 | −514.87058 | −21.29114 | caf2 | |
| 48 | −39003.71488 | −2.51668 | | |
| 49 | −616.56989 | −17.52530 | caf2 | |
| 50 | −3.5E+05 | −1.83409 | | |
| 51 | −910.87500 | −24.55409 | caf2 | |

TABLE 1-continued

DISTANCE FROM FIRST OBJECT~FIRST SURFACE: 41.15312 mm

| i | ri | di | LENS MATERIAL |
|---|---|---|---|
| 52 | −11464.91757 | −1.01683 | |
| 53 | −209.21733 | −49.49135 | caf2 |
| 54 | 0.00000 | −9.95147 | |

L = 997.84 mm
β = ¼
NA = 0.80
|β1/NAO| = 5.29
|β1 · βf/NAO| = 7.65
|β1| = 1.057
a/b = 0.0538
b/c = 0.479

| ASPHERICAL SURFACES | | | | |
|---|---|---|---|---|
| i | K | A | B | C |
| 1 | 0.67157400 | −3.12148340E−09 | 1.24961887E−13 | −1.07206311E−17 |
| 6 | −0.26422545 | −4.07630359E−09 | −3.74292072E−13 | −1.46846516E−17 |
| 10 | −0.04052878 | −5.40216034E−09 | 1.46578961E−13 | 6.53664151E−20 |
| 16 | −0.04052878 | −5.40216034E−09 | 1.46578961E−13 | 6.53664151E−20 |
| 20 | −0.26422545 | −4.07630359E−09 | −3.74292072E−13 | −1.46846516E−17 |
| 23 | −0.06868808 | −1.05721576E−08 | −4.79962790E−14 | 4.74439039E−19 |
| 25 | 1.04273198 | −4.70121479E−09 | 1.07389747E−13 | 1.24811271E−18 |
| 32 | −1.01492628 | −1.96968709E−08 | 2.44323828E−13 | −4.76571749E−18 |
| 34 | −0.45182630 | 2.12897818E−08 | 2.93116566E−13 | 1.54392512E−17 |
| 39 | −1.99465650 | −3.89130899E−08 | 5.64229062E−13 | 7.10821780E−18 |
| 41 | −1.09917187 | −1.56104003E−08 | 6.72159485E−13 | −3.21066701E−17 |
| 47 | 1.46551924 | 5.88942104E−08 | 3.79528671E−12 | −2.62771281E−16 |
| 51 | −2.04763264 | −6.93796147E−08 | −3.23034550E−12 | 8.79032313E−16 |
| 53 | −0.58689189 | −4.47928864E−08 | 1.18331479E−13 | −2.99578474E−16 |
| i | D | E | F | G |
| 1 | 3.02396381E−21 | −4.17118053E−25 | 2.78125431E−29 | −6.44187470E−34 |
| 6 | 2.129024 13E−21 | −2.81497785E−25 | 1.50694792E−29 | −3.53816272E−34 |
| 10 | 2.55935824E−22 | −2.01752638E−27 | −4.05301590E−31 | 2.49240398E−35 |
| 16 | 2.55935824E−22 | −2.01752638E−27 | −4.05301590E−31 | 2.49240398E−35 |
| 20 | 2.12902413E−21 | −2.81497785E−25 | 1.50694792E−29 | −3.53816272E−34 |
| 23 | −8.39315466E−22 | 4.89327799E−26 | −1.86906734E−30 | −1.91328722E−36 |
| 25 | 3.43732001E−22 | −7.17783414E−28 | −2.94948641E−31 | 3.96862254E−35 |
| 32 | −5.04835667E−22 | 6.49443358E−26 | −3.00384245E−30 | 6.50850163E−35 |
| 34 | 4.13121834E−22 | −3.42060737E−26 | 3.13448029E−30 | −1.26160384E−34 |
| 39 | 3.92603930E−22 | −8.05151085E−26 | 2.70060158E−30 | −5.33417169E−35 |
| 41 | 1.37582551E−21 | −5.72809395E−26 | 1.81888057E−30 | −1.90531697E−35 |
| 47 | −1.60589201E−20 | 2.16600278E−24 | −9.01334418E−29 | 1.30281885E−33 |
| 51 | −4.52726701E−20 | 5.98777721E−24 | −4.25816067E−28 | 1.53629738E−32 |
| 53 | −2.91098686E−19 | 7.52634824E−23 | −1.41750767E−26 | 8.34861881E−31 |

Second Embodiment

Figure 4:
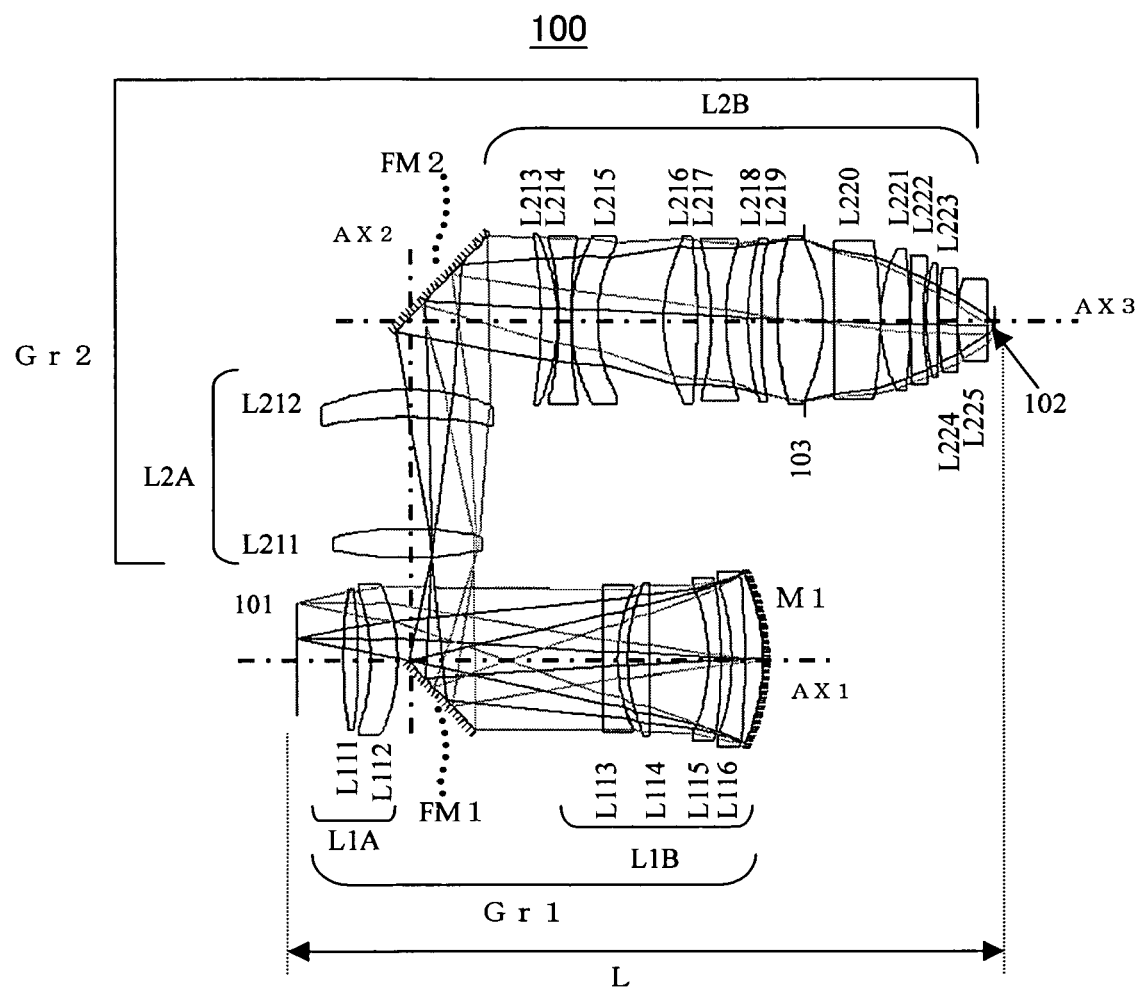
FIG. 4 is an optical-path diagram showing a configuration of the catadioptric projection optical system according to the present invention.

FIG. 4 is an optical-path diagram showing a configuration of the catadioptric projection optical system 100 of the second embodiment. Referring to FIG. 4, the catadioptric projection optical system 100 includes, in order from the first object 101 side, a first imaging optical system Gr1 and a second imaging optical system Gr2.

The first imaging optical system Gr1 includes, in order from the first object 101 side, a lens unit L1A having a positive refractive power, a reciprocating optical system (part) L1B having a negative refractive power, and a concave mirror M1.

The lens unit L1A includes, along the light traveling direction from the side of the first object 101, an aspheric positive lens L111 and a positive lens L112. The aspheric positive lens L111 has a biconvex form. The positive lens L112 has a meniscus form that has a convex surface oriented toward a side opposite to the first object 101 side.

The reciprocating optical system L1B includes an aspheric negative lens L113, a positive lens L114, an aspheric negative lens L115, a negative lens L116, and a concave mirror M1. The aspheric negative lens L113 has an approximately planoconcave form that has a concave surface oriented toward a side opposite to the first object 101 side. The positive lens L114 has an approximately planoconvex form that has a convex surface oriented toward the first object 101 side. The aspheric negative lens L115 has a meniscus form that has a concave mirror oriented toward the first object 101 side. The negative lens L116 has a meniscus form that has a concave surface oriented toward the first object 101 side. The concave mirror M1 has a concave form that has a concave surface oriented toward the first object 101 side.

The light from the first object 101 passes through the lens unit L1A, enters the reciprocating optical system L1B, is reflected at the concave mirror M1, and reenters the reciprocating optical system L1B. Then, a deflective reflector FM1 deflects the optical axis AX1 to the optical axis AX2 by 90°. The light is also reflected, and an intermediate image IMG is formed.

The first deflective reflector FM1 is arranged between the first imaging optical system Gr1 and the second imaging optical system Gr2. Preferably, as in the instant embodiment, the first deflective reflector FM1 is arranged between the intermediate image IMG and the reciprocating optical system L1B. In the instant embodiment, the first deflective reflector FM1 uses a flat mirror.

The second imaging optical system Gr2 includes a lens unit L2A having a positive refractive power and a lens unit L2B having a positive refractive power.

The lens unit L2A includes, along the light traveling direction from the side of the first imaging optical system Gr1, a biconvex aspheric positive lens L211 and a meniscus aspheric positive lens L212 with its convex surface oriented toward a side opposite to the intermediate image IMG side.

The lens unit L2B includes a positive lens L213, a negative lens L214, an aspheric positive lens L215, an aspheric positive lens L216, a negative lens L217, an aspheric positive lens L218, an aspheric positive lens L219, an aperture stop 103, a positive lens L220, a positive lens L221, an aspheric negative lens L222, a positive lens L223, an aspheric positive lens L224, and an aspheric positive lens L225. The positive lens L213 has a meniscus form that has a convex surface oriented toward the second object 102 side. The negative lens L214 has a biconcave form. The aspheric positive lens L215 has a meniscus form that has a convex surface oriented toward a side opposite to the second object 102 side. The aspheric positive lens L216 has an approximately planoconvex form that has a convex surface oriented toward a side opposite to the second object 102 side. The negative lens L217 has a biconcave form. The aspheric positive lens L218 has a meniscus form that has a convex surface oriented toward a side opposite to the second object 102 side. The aspheric positive lens L219 has a biconvex form. The positive lens L220 has a meniscus form that has a convex surface oriented toward the second object 102 side. The positive lens L221 has an approximately planoconvex form that has a convex surface oriented toward a side opposite to the second object 102 side. The aspheric negative lens L222 has an approximately planoconvex form that has a convex surface oriented toward a side opposite to the second object 102 side. The positive lens L223 has an approximately planoconvex form that has a convex surface oriented toward a side opposite to the second object 102 side. The aspheric positive lens L224 has an approximately planoconvex form that has a convex surface oriented toward a side opposite to the second object 102 side. The aspheric positive lens L225 has a planoconvex form that has a plane surface oriented toward the second object 102 side.

The second deflective reflector FM2 is arranged between the lens unit L2A and the lens unit L2B of the second imaging optical system Gr2. The present embodiment makes the second deflective reflector FM2 of a plane mirror for deflecting the light reflected from the first deflective reflector FM1 in a predetermined direction.

The aperture stop 103 is arranged between the aspheric positive lens L219 and the positive lens L220.

The catadioptric projection optical system 100 of the second embodiment uses a projection magnification of ¼, a reference wavelength of 157 nm, and calcium fluoride as a glass material. An image-side numerical aperture is NA=0.80. An object-image distance (the first object 101 surface to the second object 102 surface) is L=1051.59 mm. An aberration-corrected object point in a range of about 7.50 to 20.25 mm secures a rectangular exposure area of at least 26 mm long and 8 mm wide.

Figure 5:
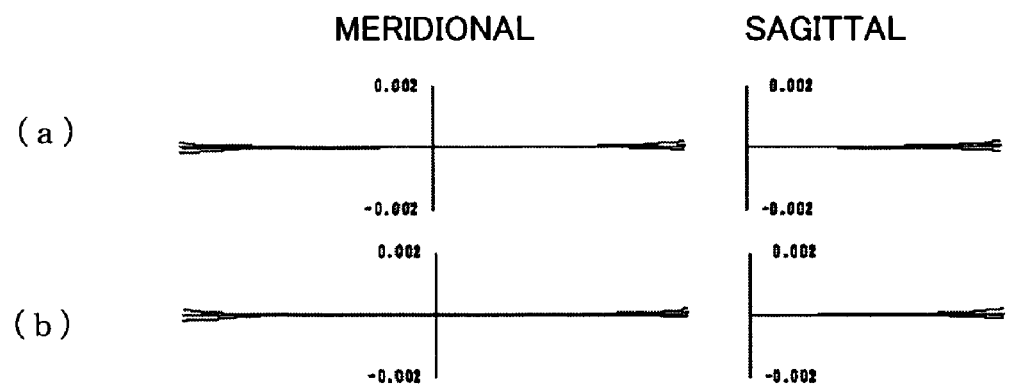
FIG. 5 is an aberrational diagram of the catadioptric projection optical system shown in FIG. 4.

FIG. 5 shows a lateral aberration diagram of the catadioptric projection optical system 100 of the second embodiment. FIG. 5 shows a wavelength with a reference wavelength of 157.6 nm±0.6 pm. Understandably, monochrome and chromatic aberrations are satisfactorily corrected. FIG. 5A shows a lateral aberration diagram for light from an off-axis area that has an image point of 7.5 mm in the second object 102. On the other hand, FIG. 5B shows a lateral aberration diagram for light from an off-axis area that has an image point of 20.25 mm in the second object 102.

The following Table 2 shows the specification of the numerical example of the catadioptric projection optical system 100 of the second embodiment. Symbols in the table are the same as in table 1, and thus a description thereof will be omitted.

TABLE 2

DISTANCE FROM FIRST OBJECT~FIRST SURFACE: 69.87426 mm

| i | ri | di | LENS MATERIAL | |
|---|---|---|---|---|
| 1 | 668.40243 | 20.22118 | caf2 | |
| 2 | -909.99969 | 20.15953 | | |
| 3 | -278.78157 | 41.82957 | caf2 | |
| 4 | -226.53067 | 306.96914 | | |
| 5 | -9013.50255 | 21.17315 | caf2 | |
| 6 | 227.11071 | 14.30268 | | |
| 7 | 252.59236 | 32.41133 | caf2 | |
| 8 | 3060.02052 | 91.62181 | | |
| 9 | -251.66991 | 20.06219 | caf2 | |
| 10 | -657.64908 | 16.70481 | | |
| 11 | -298.52631 | 20.01564 | caf2 | |
| 12 | -1155.92042 | 27.46979 | | |
| 13 | -277.46695 | -27.46979 | | M1 |
| 14 | -1155.92042 | -20.01564 | caf2 | |
| 15 | -298.52631 | -16.70481 | | |
| 16 | -657.64908 | -20.06219 | caf2 | |
| 17 | -251.66991 | -91.62181 | | |
| 18 | 3060.02052 | -32.41133 | caf2 | |
| 19 | 252.59236 | -14.30268 | | |
| 20 | 22.11071 | -21.17315 | caf2 | |
| 21 | -9013.50255 | -292.82106 | | |
| 22 | 0.00000 | 144.98564 | | FM1 |
| 23 | 504.78955 | 42.62735 | caf2 | |
| 24 | -475.98929 | 158.10011 | | |
| 25 | -803.47768 | 40.00000 | caf2 | |
| 26 | -340.39441 | 99.24315 | | |
| 27 | 0.00000 | -200.01742 | | FM2 |
| 28 | 627.21306 | -24.57765 | caf2 | |
| 29 | 275.15619 | -2.32909 | | |
| 30 | 434.05214 | -17.83341 | caf2 | |
| 31 | -685.95720 | -1.00000 | | |
| 32 | -266.06165 | -40.00000 | caf2 | |
| 33 | -236.39777 | -98.47464 | | |
| 34 | -201.23101 | -52.61738 | caf2 | |
| 35 | 998.68752 | -20.80028 | | |
| 36 | 428.05968 | -23.38703 | caf2 | |
| 37 | -330.13594 | -34.04513 | | |
| 38 | -398.32107 | -20.33655 | caf2 | |
| 39 | -1741.28350 | -24.68386 | | |
| 40 | -465.91801 | -68.95155 | caf2 | |
| 41 | 214.11384 | 28.60841 | | |
| 42 | 0.00000 | -46.19472 | | APERTURE STOP |
| 43 | 2389.68736 | -67.41845 | caf2 | |
| 44 | 666.87372 | -1.01683 | | |
| 45 | -213.66192 | -44.46924 | caf2 | |
| 46 | 954.85885 | -1.01683 | | |
| 47 | -795.17615 | -20.28664 | caf2 | |
| 48 | -550.11819 | -3.06249 | | |
| 49 | -349.24693 | -17.50613 | caf2 | |
| 50 | -16687.89701 | -2.30561 | | |
| 51 | -925.70468 | -24.79031 | caf2 | |
| 52 | -47751.77910 | -1.01683 | | |
| 53 | -190.68875 | -45.82729 | caf2 | |
| 54 | 0.00000 | -9.99596 | | |

L = 1051.59 mm
β = ¼
NA = 0.80
|β1/NA0| = 6.11
|β1 · βf/NA0| = 8.15
|β1| = 1.222
a/b = 0.00088
b/c = 0.470

| ASPHERICAL SURFACES | | | | |
|---|---|---|---|---|
| i | K | A | B | C |
| 1 | 1.84472719 | −4.28737069E−09 | −4.41427710E−14 | 8.11274173E−18 |
| 6 | −0.27189589 | −4.22360534E−09 | −3.66149757E−13 | −5.21688557E−18 |
| 10 | 0.49938484 | −6.02516745E−09 | 1.48782891E−13 | −9.03391986e−019 |
| 16 | 0.49938484 | −6.02516745E−09 | 1.48782891E−13 | 9.03391986E−19 |
| 20 | −0.27189589 | −4.22360534E−09 | −3.66149757E−13 | −5.21688557E−18 |
| 23 | 0.79344720 | −9.58055891E−09 | −1.44694100E−13 | 1.99136296E−17 |
| 25 | 0.38159869 | −7.27012352E−09 | 7.67976427E−14 | −2.01234702E−19 |
| 32 | −0.46697051 | −2.04044049E−08 | 3.74018192E−13 | −1.16647192E−17 |
| 34 | −0.53480624 | 2.26188296E−08 | 2.79329047E−13 | 1.85357176E−17 |
| 39 | −1.08351559 | −3.95543216E−08 | 2.30977379E−13 | 9.83209623E−18 |
| 41 | −0.95966217 | −1.45575701E−08 | 7.81477775E−13 | −3.03683767E−17 |
| 47 | −0.95442908 | 5.47250405E−08 | 4.34318997E−12 | −2.78298594E−16 |
| 51 | −1.96075510 | −9.49376715E−08 | −3.00111451E−12 | 5.98641043E−16 |
| 53 | −1.17537128 | −1.33444944E−08 | 4.64806503E−12 | −2.23525496E−16 |

| i | D | E | F | G |
|---|---|---|---|---|
| 1 | −2.07377580E−21 | 2.14738504E−25 | −1.19376730E−29 | 3.39039856E−34 |
| 6 | 1.44705561E−21 | −1.96777906E−25 | 1.14310793E−29 | −2.72077599E−34 |
| 10 | −3.13004905E−24 | 2.20935958E−26 | −1.66002358E−30 | 5.39928337E−35 |
| 16 | −3.13004905E−24 | 2.20935958E−26 | −1.66002358E−30 | 5.39928337E−35 |
| 20 | 1.44705561E−21 | −1.96777906E−25 | 1.14310793E−29 | −2.72077599E−34 |
| 23 | −1.84064584E−21 | 1.07963092E−25 | −3.78934188E−30 | 5.69453371E−35 |
| 25 | 9.84789574E−23 | −7.73186611E−27 | 2.70919906E−31 | −5.25476041E−36 |
| 32 | 3.68781098E−22 | 7.76457500E−28 | −3.63007208E−31 | 1.53597787E−35 |
| 34 | 2.89666734E−22 | −2.25156851E−26 | 2.54901422E−30 | −1.14638254E−34 |
| 39 | 1.67679893E−22 | −2.86823967E−26 | −6.87337289E−31 | 9.61735989E−36 |
| 41 | 1.39961175E−21 | −5.53226831E−26 | 1.81465248E−30 | −2.39708052E−35 |
| 47 | −1.07107681E−20 | 1.28989008E−24 | −2.57193395E−29 | −6.39379334E−34 |
| 51 | −2.74686808E−20 | 7.84557981E−24 | −8.32541969E−28 | 6.57146205E−32 |
| 53 | −2.70340899E−19 | 1.28545363E−23 | −1.76779835E−27 | −1.06366211E−30 |

Third Embodiment

Figure 6:
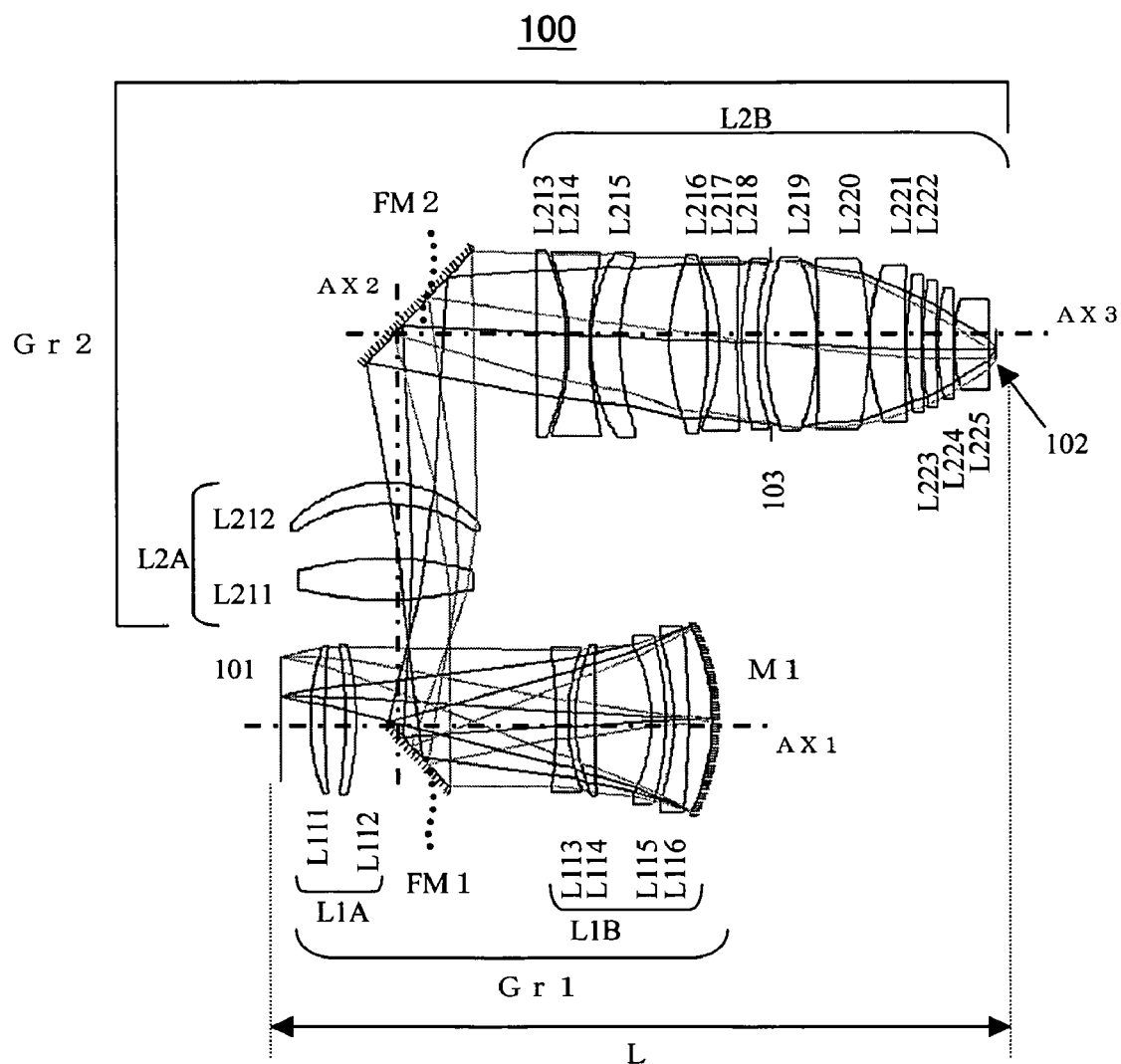
FIG. 6 is an optical-path diagram showing a configuration of the catadioptric projection optical system according to the present invention.

FIG. 6 is an optical-path diagram showing a configuration of the catadioptric projection optical system 100 of the third embodiment. Referring to FIG. 6, the catadioptric projection optical system 100 includes, in order from the first object 101 side, a first imaging optical system Gr1 and a second imaging optical system Gr2.

The first imaging optical system Gr1 includes, in order from the first object 101 side, a lens unit L1A having a positive refractive power, a reciprocating optical system (part) L1B having a negative refractive power, and a concave mirror M1.

The lens unit L1A includes, along the light traveling direction from the side of the first object 101, an aspheric positive lens L111 and a positive lens L112. The aspheric positive lens L111 has an approximately planoconvex form that has a convex surface oriented toward the first object 101 side. The positive lens L112 has a meniscus form that has a convex surface oriented toward a side opposite to the first object 101 side.

The reciprocating optical system L1B includes an aspheric negative lens L113, a positive lens L114, an aspheric negative lens L115, a negative lens L116, and a concave mirror M1. The aspheric negative lens L113 has a biconcave form. The positive lens L114 has an approximately planoconvex form that has a convex surface oriented toward the first object 101 side. The aspheric negative lens L115 has a meniscus form that has a concave mirror oriented toward the first object 101 side. The negative lens L116 has a meniscus form that has a concave surface oriented toward the first object 101 side. The concave mirror M1 has a concave form that has a concave surface oriented toward the first object 101 side.

The light from the first object 101 passes through the lens unit L1A, enters the reciprocating optical system L1B, is reflected at the concave mirror M1, and reenters the reciprocating optical system L1B. Then, a deflective reflector FM1 deflects the optical axis AX1 to the optical axis AX2 by 90°. The light is also reflected, and an intermediate image IMG is formed.

The first deflective reflector FM1 is arranged between the first imaging optical system Gr1 and the second imaging optical system Gr2. Preferably, as in the instant embodiment, the first deflective reflector FM1 is arranged between the intermediate image IMG and the reciprocating optical system L1B. In the instant embodiment, the first deflective reflector FM1 uses a flat mirror.

The second imaging optical system Gr2 includes a lens unit L2A having a positive refractive power and a lens unit L2B having a positive refractive power.

The lens unit L2A includes, along the light traveling direction from the side of the first imaging optical system Gr1, an aspheric positive lens L211 and an aspheric positive lens L212. The aspheric positive lens L211 has a biconvex form. The aspheric positive lens L212 has a meniscus form that has a convex surface oriented toward a side opposite to the intermediate image IMG side.

The lens unit L2B includes a positive lens L213, a negative lens L214, an aspheric positive lens L215, an aspheric positive lens L216, a negative lens L217, an aspheric positive lens L218, an aperture stop 103, an aspheric positive lens L219, a positive lens L220, a positive lens L221, an aspheric positive lens L222, a positive lens L223, an aspheric positive lens L224, and an aspheric positive lens L225. The positive lens L213 has a meniscus form that has a convex surface oriented toward the second object 102 side. The negative lens L214 has a biconcave form. The aspheric positive lens L215 has a meniscus form that has a convex surface oriented toward a side opposite to the second object 102 side. The aspheric positive lens L216 has a biconvex form. The negative lens L217 has an approximately planoconcave form that has a concave surface oriented toward a side opposite to the second object 102 side. The aspheric positive lens L218 has a meniscus form that has a convex surface oriented toward a side opposite to the second object 102 side. The aspheric positive lens L219 has a biconvex form. The positive lens L220 has an approximately planoconvex form that has a convex surface oriented toward the second object 102 side. The positive lens L221 has an approximately planoconvex form that has a convex surface oriented toward a side opposite to the second object 102 side. The aspheric positive lens L222 has an approximately planoconvex form that has a convex surface oriented toward a side opposite to the second object 102 side. The positive lens L223 has an approximately planoconvex form that has a convex surface oriented toward a side opposite to the second object 102 side. The aspheric positive lens L224 has an approximately planoconvex form that has a convex surface oriented toward a side opposite to the second object 102 side. The aspheric positive lens L225 has a planoconvex form that has a plane surface oriented toward the second object 102 side.

The second deflective reflector FM2 is arranged between the lens unit L2A and the lens unit L2B of the second imaging optical system Gr2. The present embodiment makes the second deflective reflector FM2 of a plane mirror for deflecting the light reflected from the first deflective reflector FM1 in a predetermined direction.

The aperture stop 103 is arranged between the aspheric positive lens L218 and the aspheric positive lens L219.

The catadioptric projection optical system 100 of the third embodiment uses a projection magnification of ¼, a reference wavelength of 157 nm, and calcium fluoride as a glass material. An image-side numerical aperture is NA=0.80. An object-image distance (the first object 101 surface to the second object 102 surface) is L=983.40 mm. An aberration-corrected object point in a range of about 7.50 to 20.25 mm secures a rectangular exposure area of at least 26 mm long and 8 mm wide.

Figure 7:
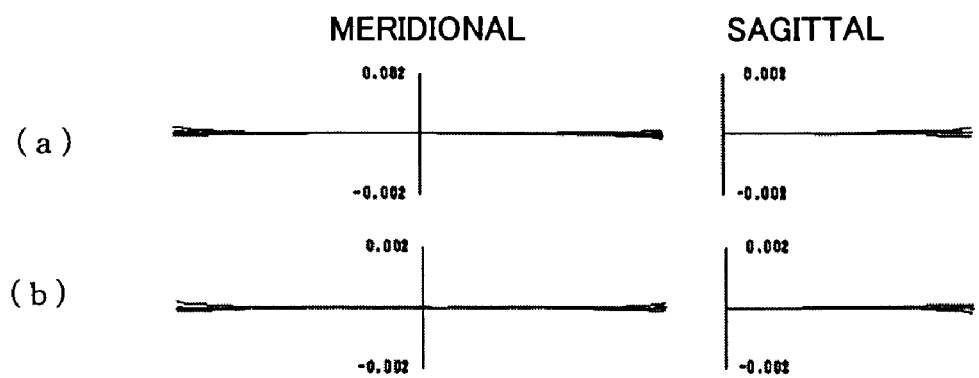
FIG. 7 is an aberrational diagram of the catadioptric projection optical system shown in FIG. 6.

FIG. 7 shows a lateral aberration diagram of the catadioptric projection optical system 100 of the third embodiment. FIG. 7 shows a wavelength with a reference wavelength of 157.6 nm±0.6 pm. Understandably, monochrome and chromatic aberrations are satisfactorily corrected. FIG. 7A shows a lateral aberration diagram for light from an off-axis area that has an image point of 7.5 mm in the second object 102. On the other hand, FIG. 7B shows a lateral aberration diagram for light from an off-axis area that has an image point of 20.25 mm in the second object 102.

The following Table 3 shows the specification of the numerical example of the catadioptric projection optical system 100 of the third embodiment. Symbols in the table are the same as in Table 1, and thus a description thereof will be omitted.

TABLE 3

DISTANCE FROM FIRST OBJECT~FIRST SURFACE: 40.13403 mm

| i | ri | di | LENS MATERIAL | |
|---|---|---|---|---|
| 1 | 260.11007 | 20.22118 | caf2 | |
| 2 | 883.38340 | 28.09241 | | |
| 3 | −591.69377 | 15.01918 | caf2 | |
| 4 | −368.85812 | 275.56936 | | |
| 5 | −637.38698 | 17.50000 | caf2 | |
| 6 | 247.67865 | 10.07938 | | |
| 7 | 235.57254 | 26.31032 | caf2 | |
| 8 | 3135.07017 | 78.00000 | | |
| 9 | −197.51950 | 20.09812 | caf2 | |
| 10 | −356.26642 | 10.74741 | | |
| 11 | −321.57746 | 20.31945 | caf2 | |
| 12 | −1046.94074 | 32.68661 | | |
| 13 | −269.59967 | −32.68661 | | M1 |
| 14 | −1046.94074 | −20.31945 | caf2 | |
| 15 | −321.57746 | −10.74741 | | |
| 16 | −356.26642 | −20.09812 | caf2 | |
| 17 | −197.51950 | −78.00000 | | |
| 18 | 3135.07017 | −26.31032 | caf2 | |
| 19 | 235.57254 | −10.07938 | | |
| 20 | 247.67865 | −17.50000 | caf2 | |
| 21 | −637.38698 | −235.06352 | | |
| 22 | 0.00000 | 154.78510 | | FM1 |
| 23 | 412.53248 | 53.86090 | caf2 | |
| 24 | −454.52997 | 71.16043 | | |
| 25 | −247.59332 | 27.54356 | caf2 | |
| 26 | −183.91506 | 181.23623 | | |
| 27 | 0.00000 | −210.98345 | | FM2 |
| 28 | 3767.23604 | −39.78178 | caf2 | |
| 29 | 277.50559 | −3.63851 | | |
| 30 | 292.85727 | −29.63790 | caf2 | |
| 31 | −458.45291 | −1.33883 | | |
| 32 | −246.79815 | −39.85383 | caf2 | |
| 33 | −311.59024 | −68.58748 | | |
| 34 | −235.53718 | −52.59735 | caf2 | |
| 35 | 467.79877 | −16.47474 | | |
| 36 | 245.94544 | −23.38703 | caf2 | |
| 37 | −2118.42723 | −7.42790 | | |
| 38 | −493.38965 | −20.33655 | caf2 | |
| 39 | −516.74517 | −17.40457 | | |
| 40 | 0.00000 | 7.00000 | | APERTURE STOP |
| 41 | −316.79913 | −70.00000 | caf2 | |
| 42 | 273.85870 | −1.51310 | | |
| 43 | 6275.38113 | −69.81106 | caf2 | |
| 44 | 449.01624 | −1.01683 | | |
| 45 | −286.22645 | −48.61231 | caf2 | |
| 46 | −3757.65238 | −1.01683 | | |
| 47 | −300.84255 | −21.04400 | caf2 | |
| 48 | −1531.14490 | −1.21708 | | |
| 49 | −447.05091 | −17.57713 | caf2 | |
| 50 | −913.33797 | −3.39970 | | |
| 51 | −417.01084 | −21.41824 | caf2 | |
| 52 | −42099.53696 | −1.01683 | | |
| 53 | −233.68723 | −47.62945 | caf2 | |
| 54 | 0.00000 | −9.70059 | | |

L = 983.40 mm
β = ¼
NA = 0.80
|β1/NA0| = 5.13
|β1 · βf/NA0| = 8.25
|β1| = 1.025
a/b = 0.0455
b/c = 0.518

| ASPHERICAL SURFACES | | | | |
|---|---|---|---|---|
| i | K | A | B | C |
| 1 | 0.49697074 | −2.67716672E−09 | −1.74309788E−13 | −2.09170434E−17 |
| 6 | 1.41328830 | 2.07799210E−09 | −4.26185978E−13 | −1.25267670E−17 |
| 10 | 0.46617565 | −6.84466829E−09 | 4.50692462E−14 | 1.72893414E−18 |
| 16 | 0.46617565 | −6.84466829E−09 | 4.50692462E−14 | 1.72893414E−18 |
| 20 | 1.41328830 | 2.07799210E−09 | −4.26185978E−13 | −1.25267670E−17 |
| 23 | −1.99692838 | −1.46408021E−08 | 1.07386812E−13 | −6.57916448E−18 |
| 25 | 0.94768025 | −6.48013865E−09 | 1.29506074E−13 | 4.41070720E−18 |
| 32 | −0.53069421 | −2.29496734E−08 | 1.46540612E−13 | −9.48243024E−18 |
| 34 | −0.58592559 | 2.27047629E−08 | 3.72962833E−13 | 1.78675689E−17 |
| 39 | −1.99829606 | −4.02933770E−08 | 2.28490744E−13 | 7.09139430E−18 |
| 42 | −0.94509911 | −1.45135015E−08 | 7.57078652E−13 | −3.77421659E−17 |
| 47 | −0.10298455 | 5.88225502E−08 | 3.64981480E−12 | −2.36226284E−16 |
| 51 | 1.94997831 | −8.00801793E−08 | −2.73886338E−12 | 1.03434118E−15 |
| 53 | 1.64235579 | −5.98172801E−08 | 1.56058112E−14 | −1.19221610E−15 |
| i | D | E | F | G |
| 1 | 5.18497263E−21 | −3.60189028E−25 | −2.65126620E−30 | 8.30507568E−34 |
| 6 | 1.97675878E−21 | −4.91077476E−25 | 3.61319930E−29 | −1.06824258E−33 |
| 10 | 9.58499269E−23 | 1.84965678E−26 | −1.35380227E−30 | 8.38070131E−35 |
| 16 | 9.58499269E−23 | 1.84965678E−26 | −1.35380227E−30 | 8.38070131E−35 |
| 20 | 1.97675878E−21 | −4.91077476E−25 | 3.61319930E−29 | −1.06824258E−33 |
| 23 | −9.13728385E−22 | 6.08826931E−26 | −1.87726545E−30 | −1.11307008E−35 |
| 25 | 1.23647754E−22 | 5.82476981E−27 | −5.35142438E−32 | 1.80315832E−35 |
| 32 | −6.38425458E−23 | 2.33580442E−26 | −1.42562786E−30 | 3.23706771E−35 |
| 34 | 4.66470849E−22 | −3.26187824E−26 | 2.87894208E−30 | −1.29130160E−34 |
| 39 | 1.77831564E−22 | −9.56219011E−26 | 2.37030856E−30 | −3.53254917E−35 |
| 42 | 1.72360268E−21 | −5.67160176E−26 | 2.05866748E−30 | −4.37198713E−35 |
| 47 | −1.97220610E−20 | 2.18183279E−24 | −1.06203934E−28 | 3.10574248E−33 |
| 51 | −8.68250406E−21 | 2.25723562E−24 | 3.04027040E−28 | −7.08468501E−32 |
| 53 | −1.80303110E−19 | 6.84072538E−23 | −1.99950230E−26 | 2.10385493E−30 |

Fourth Embodiment

Figure 8:
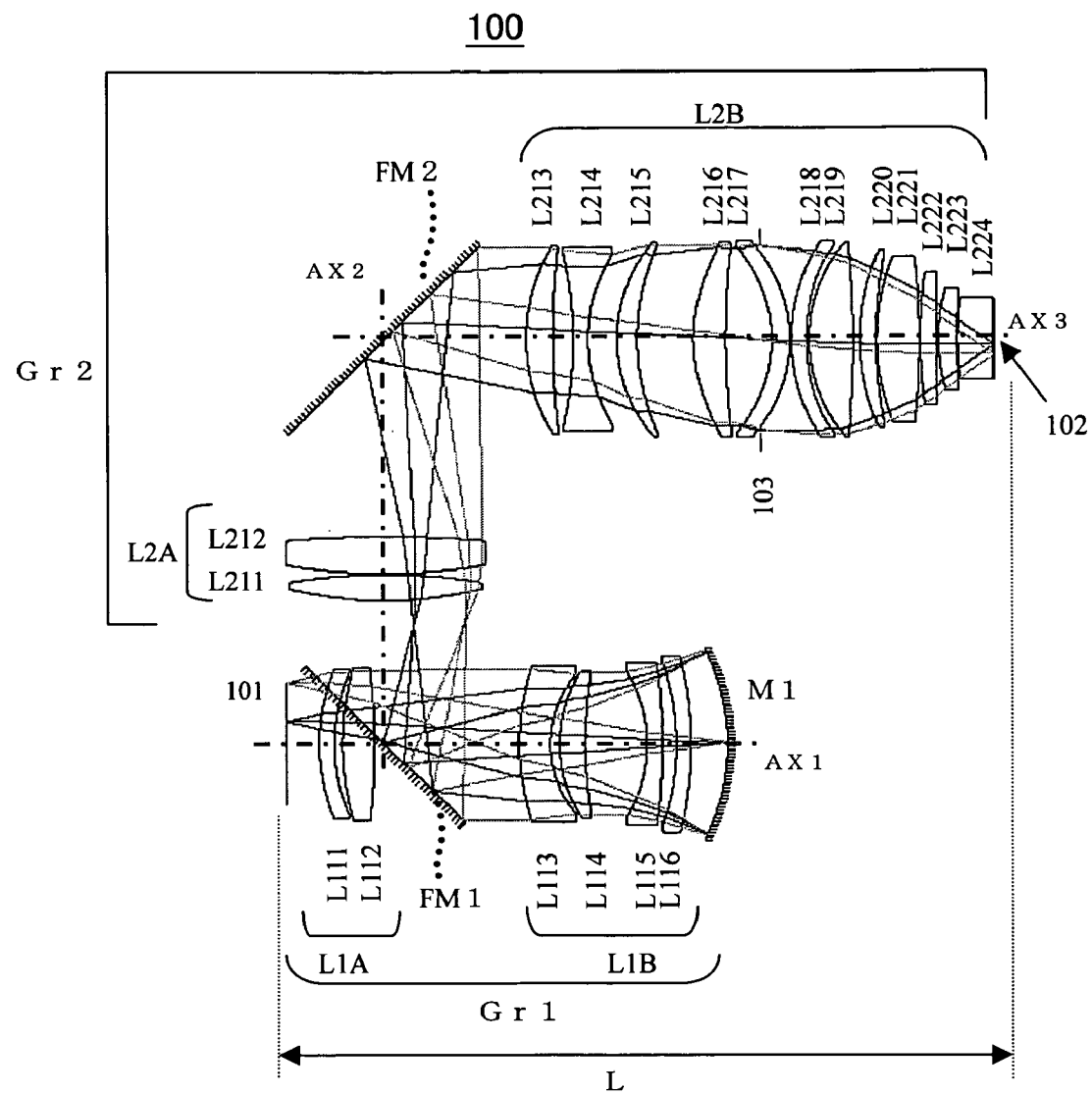
FIG. 8 is an optical-path diagram showing a configuration of the catadioptric projection optical system according to the present invention.

FIG. 8 is an optical-path diagram showing a configuration of the catadioptric projection optical system 100 of the fourth embodiment. Referring to FIG. 8, the catadioptric projection optical system 100 includes, in order from the first object 101 side, a first imaging optical system Gr1 and a second imaging optical system Gr2.

The first imaging optical system Gr1 includes, in order from the first object 101 side, a lens unit L1A having a positive refractive power, a reciprocating optical system (part) L1B having a negative refractive power, and a concave mirror M1.

The lens unit L1A includes, along the light traveling direction from the side of the first object 101, an positive lens L111 and a positive lens L112. The positive lens L111 has a meniscus form that has a convex surface oriented toward the first object 101 side. The positive lens L112 has an approximately planoconvex form that has a convex surface oriented toward the first object 101 side.

The reciprocating optical system L1B includes an negative lens L113, an aspheric positive lens L114, an aspheric negative lens L115, a negative lens L116, and a concave mirror M1. The negative lens L113 has a meniscus form that has a concave surface oriented toward a side opposite to the first object 101 side. The aspheric positive lens L114 has an approximately planoconvex form that has a convex surface oriented toward the first object 101 side. The aspheric negative lens L115 has a meniscus form that has a concave mirror oriented toward the first object 101 side. The negative lens L116 has a meniscus form that has a concave surface oriented toward the first object 101 side. The concave mirror M1 has a concave form that has a concave surface oriented toward the first object 101 side.

The light from the first object 101 passes through the lens unit L1A, enters the reciprocating optical system L1B, is reflected at the concave mirror M1, and reenters the reciprocating optical system L1B. Then, a deflective reflector FM1 deflects the optical axis AX1 to the optical axis AX2 by 90°. The light is also reflected, and an intermediate image IMG is formed.

The first deflective reflector FM1 is arranged between the first imaging optical system Gr1 and the second imaging optical system Gr2. Preferably, as in the instant embodiment, the first deflective reflector FM1 is arranged between the intermediate image IMG and the reciprocating optical system L1B. In the instant embodiment, the first deflective reflector FM1 uses a flat mirror.

The second imaging optical system Gr2 includes a lens unit L2A having a positive refractive power and a lens unit L2B having a positive refractive power.

The lens unit L2A includes, along the light traveling direction from the side of the first imaging optical system Gr1, an aspheric positive lens L211 and a positive lens L212. The aspheric positive lens L211 has a biconvex form. The positive lens L212 has an approximately planoconvex form that has a convex surface oriented toward a side opposite to the intermediate image IMG side.

The lens unit L2B includes a positive lens L213, a negative lens L214, a positive lens L215, an aspheric positive lens L216, a positive lens L217, an aperture stop 103, an aspheric positive lens L218, an aspheric positive lens L219, a positive lens L220, a positive lens L221, an aspheric positive lens L222, a positive lens L223, and an aspheric positive lens L224. The positive lens L213 has an approximately planoconvex form that has a convex surface oriented toward a side opposite to the second object 102 side. The negative lens L214 has a biconcave form. The positive lens L215 has a meniscus form that has a convex surface oriented toward a side opposite to the second object 102 side. The aspheric positive lens L216 has an approximately planoconvex form that has a convex surface oriented toward a side opposite to the second object 102 side. The positive lens L217 has a meniscus form that has a convex surface oriented toward the second object 102 side. The aspheric positive lens L218 has a meniscus form that has a convex surface oriented toward a side opposite to the second object 102 side. The aspheric positive lens L219 has an approximately planoconvex form that has a convex surface oriented toward a side opposite to the second object 102 side. The positive lens L220 has a meniscus form that has a convex surface oriented toward a side opposite to the second object 102 side. The positive lens L221 has biconvex form. The aspheric positive lens L222 has an approximately planoconvex form that has a convex surface oriented toward a side opposite to the second object 102 side. The positive lens L223 has a meniscus form that has a convex surface oriented toward a side opposite to the second object 102 side. The aspheric positive lens L224 has a planoconvex form that has a plane surface oriented toward the second object 102 side.

A space between the final lens (aspheric positive lens L224) and the second object 102 is filled with a fluid (so-called immersion structure).

The second deflective reflector FM2 is arranged between the lens unit L2A and the lens unit L2B of the second imaging optical system Gr2. The present embodiment makes the second deflective reflector FM2 of a plane mirror for deflecting the light reflected from the first deflective reflector FM1 in a predetermined direction.

The aperture stop 103 is arranged between the positive lens L217 and the aspheric positive lens L218.

The catadioptric projection optical system 100 of the fourth embodiment uses a projection magnification of ¼, a reference wavelength of 193.0 nm, and quartz as a glass material. An image-side numerical aperture is NA=0.80. An object-image distance (the first object 101 surface to the second object 102 surface) is L=915.44 mm. An aberration-corrected object point in a range of about 7.50 to 20.25 mm secures a rectangular exposure area of at least 26 mm long and 8 mm wide.

Figure 9:
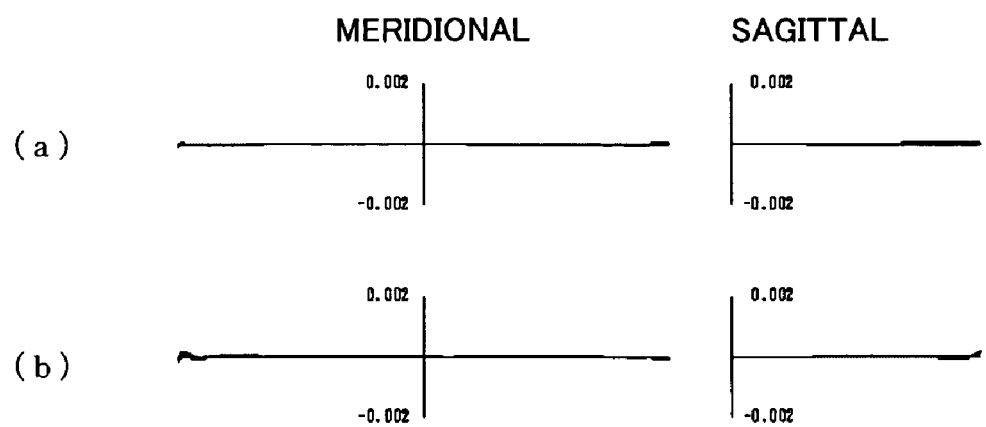
FIG. 9 is an aberrational diagram of the catadioptric projection optical system shown in FIG. 8.

FIG. 9 shows a lateral aberration diagram of the catadioptric projection optical system 100 of the fourth embodiment. FIG. 9 shows a wavelength with a reference wavelength of 193.0 nm±0.2 pm. Understandably, monochrome and chromatic aberrations are satisfactorily corrected. FIG. 9A shows a lateral aberration diagram for light from an off-axis area that has an image point of 7.5 mm in the second object 102. On the other hand, FIG. 9B shows a lateral aberration diagram for light from an off-axis area that has an image point of 20.25 mm in the second object 102.

The following Table 4 shows the specification of the numerical example of the catadioptric projection optical system 100 of the first embodiment. Symbols in the table are the same as in table 1, and thus a description thereof will be omitted. A lens glass material $SiO_2$ has a refractive index to a reference wavelength λ=193.000 nm is 1.5609. The refractive indexes of the wavelengths of +0.2 pm and −0.2 pm for the reference wavelength are, 1.56089968 and 1.56090032, respectively. A water used for the fluid has a refractive index to a reference wavelength λ=193.000 nm is 1.437. The refractive indexes of the wavelengths of +0.2 pm and −0.2 pm for the reference wavelength are, 1.43699958 and 1.43700042, respectively.

TABLE 4

DISTANCE FROM FIRST OBJECT~FIRST SURFACE: 41.84296 mm

| i | ri | di | LENS MATERIAL |
|---|---|---|---|
| 1 | 251.59420 | 20.22118 | sio2 |
| 2 | 243.48822 | 9.84632 | |
| 3 | 358.30042 | 41.97093 | sio2 |
| 4 | −826.58003 | 186.17213 | |
| 5 | 329.32922 | 40.00000 | sio2 |
| 6 | 143.12035 | 12.09278 | |
| 7 | 185.32312 | 33.31445 | sio2 |
| 8 | 608.10743 | 78.73433 | |
| 9 | −184.71011 | 20.00249 | sio2 |
| 10 | −920.52825 | 18.20389 | |
| 11 | −315.68485 | 20.04265 | sio2 |
| 12 | −456.66387 | 47.02968 | |
| 13 | −279.88964 | −47.02968 | M1 |
| 14 | −456.66387 | −20.04265 | sio2 |
| 15 | −315.68485 | −18.20389 | |
| 16 | −920.52825 | −20.00249 | sio2 |
| 17 | −184.71011 | −78.73433 | |
| 18 | 608.10743 | −33.31445 | sio2 |
| 19 | 185.32312 | −12.09278 | |
| 20 | 143.12035 | −40.00000 | sio2 |
| 21 | 329.32922 | −172.02999 | |
| 22 | 0.00000 | 188.25827 | FM1 |
| 23 | 473.33384 | 34.33669 | sio2 |
| 24 | −739.09171 | 1.01738 | |
| 25 | 731.11616 | 48.81832 | sio2' |
| 26 | −1563.77042 | 258.82118 | |
| 27 | 0.00000 | −182.46588 | FM2 |
| 28 | −240.94433 | −34.30165 | sio2 |
| 29 | −1065.13094 | −26.47287 | |
| 30 | 521.68433 | −19.11929 | sio2 |
| 31 | −217.81409 | −36.69391 | |
| 32 | −197.66602 | −26.16167 | sio2 |
| 33 | −301.60112 | −73.74535 | |
| 34 | −213.68730 | −41.82786 | sio2 |
| 35 | −1000.34292 | −59.71802 | |
| 36 | 185.13199 | −23.38703 | sio2 |
| 37 | 192.85517 | 37.83182 | |
| 38 | 0.00000 | −39.77435 | APERTURE STOP |
| 39 | −235.83972 | −20.33655 | sio2 |
| 40 | −315.29313 | −2.87277 | |
| 41 | −195.62209 | −58.03235 | sio2 |
| 42 | 942.91191 | −8.33243 | |
| 43 | −278.04337 | −21.50296 | sio2 |
| 44 | −572.88386 | −1.01683 | |
| 45 | −292.77418 | −54.84288 | sio2 |
| 46 | 1018.86198 | −1.01683 | |
| 47 | −507.84505 | −20.00707 | sio2 |
| 48 | −2582.58474 | −2.79080 | |
| 49 | −249.45727 | −23.09053 | sio2 |
| 50 | −604.76780 | −1.01683 | |
| 51 | −450.35036 | −45.52619 | sio2 |
| 52 | 0.00000 | −1.19394 | Water |

L = 915.44 mm
β = ¼
NA = 0.90
|β1/NAO| = 5.16
|β1 · βf/NAO| = 6.90
|β1| = 1.162
a/b = 0.0253
b/c = 0.498

| ASPHERICAL SURFACES | | | | |
|---|---|---|---|---|
| i | K | A | B | C |
| 7 | 0.78454747 | −1.25957857E−08 | 4.07416778E−14 | 1.60264482E−17 |
| 10 | −1.69530309 | −1.16691839E−08 | 2.52376221E−13 | −1.14340875E−17 |
| 16 | −1.69530309 | −1.16691839E−08 | 2.52376221E−13 | −1.14340875E−17 |
| 19 | 0.78454747 | −1.25957857E−08 | 4.07416778E−14 | 1.60264482E−17 |
| 23 | 1.91351250 | −9.28170033E−09 | 4.03659464E−14 | −1.09106530E−18 |
| 34 | −0.35639497 | 1.37284322E−08 | 1.44579038E−13 | 1.11740815E−17 |
| 40 | 1.12861801 | −3.75383265E−08 | −3.76644963E−13 | −8.84893402E−18 |
| 42 | −0.87144860 | −1.46351053E−08 | 5.28358771E−13 | −3.55174719E−17 |
| 47 | −2.01574807 | 3.61452387E−08 | 5.16275766E−13 | −5.59629177E−16 |
| 51 | 0.25620569 | −1.28187111E−07 | 1.11639829E−11 | 5.88022359E−15 |
| i | D | E | F | G |
| 7 | −8.64081009E−22 | 2.39680139E−25 | −1.80684184E−29 | 9.97335348E−34 |
| 10 | 3.89781033E−22 | 8.43163310E−26 | −8.08653944E−30 | 3.19305500E−34 |
| 16 | 3.89781033E−22 | 8.43163310E−26 | −8.08653944E−30 | 3.19305500E−34 |
| 19 | −8.64081009E−22 | 2.39680139E−25 | −1.80684184E−29 | 9.97335348E−34 |
| 23 | 1.57395693E−23 | −6.98047575E−28 | 2.79305776E−32 | −5.57070437E−37 |
| 34 | 9.37934698E−23 | 7.62030685E−27 | 2.35260178E−32 | 1.15757755E−35 |
| 40 | 5.33508782E−23 | 2.65574298E−26 | −2.21137735E−30 | 1.37041063E−34 |
| 42 | 1.34842682E−21 | −5.75318986E−26 | 7.02828620E−31 | −2.41667856E−35 |
| 47 | 5.11980199E−20 | −3.67799347E−24 | 2.24192126E−28 | −7.90964159E−33 |
| 51 | −1.38085824E−18 | 5.33988181E−22 | −8.31631159E−26 | 4.49781606E−30 |

Fifth Embodiment

Figure 10:
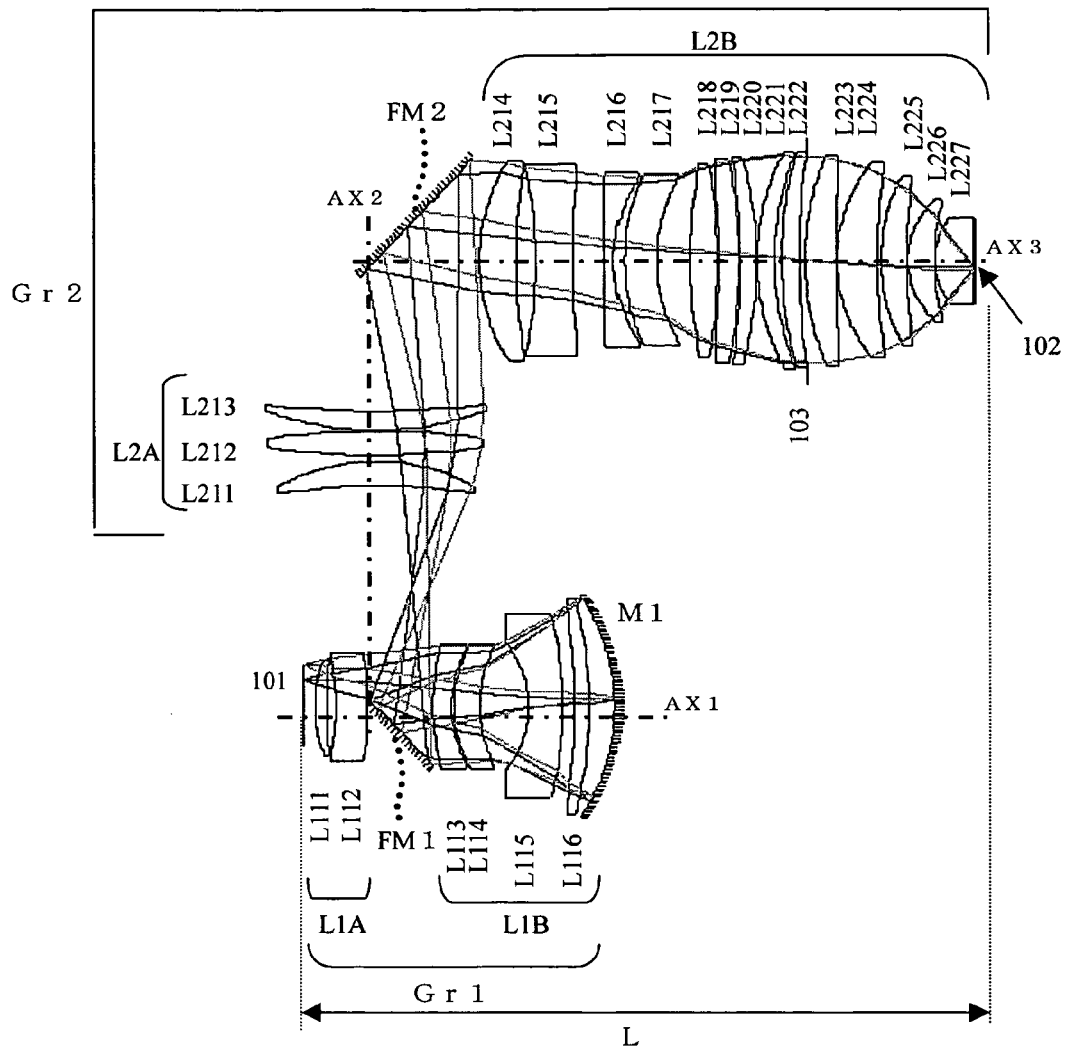
FIG. 10 is an optical-path diagram showing a configuration of the catadioptric projection optical system according to the present invention.

FIG. 10 is an optical-path diagram showing a configuration of the catadioptric projection optical system 100 of the fifth embodiment. Referring to FIG. 10, the catadioptric projection optical system 100 includes, in order from the first object 101 side, a first imaging optical system Gr1 and a second imaging optical system Gr2.

The first imaging optical system Gr1 includes, in order from the first object 101 side, a lens unit L1A having a positive refractive power, a reciprocating optical system (part) L1B having a negative refractive power, and a concave mirror M1.

The lens unit L1A includes, along the light traveling direction from the side of the first object 101, an positive lens L111 and a negative lens L112. The positive lens L111 has an approximately planoconvex form that has a convex surface oriented toward the first object 101 side. The negative lens L112 has a meniscus form that has a concave surface oriented toward the first object 101 side.

The reciprocating optical system L1B includes a negative lens L113, an aspheric positive lens L114, an aspheric negative lens L115, a positive lens L116, and a concave mirror M1. The negative lens L113 has a meniscus form that has a concave surface oriented toward a side opposite to the first object 101 side. The aspheric positive lens L114 has a meniscus form that has a convex surface oriented toward the first object 101 side. The aspheric negative lens L115 has a meniscus form that has a concave mirror oriented toward the first object 101 side. The positive lens L116 has a meniscus form that has a convex surface oriented toward a side opposite to the first object 101 side. The concave mirror M1 has a concave form that has a concave surface oriented toward the first object 101 side.

The light from the first object 101 passes through the lens unit L1A, enters the reciprocating optical system L1B, is reflected at the concave mirror M1, and reenters the reciprocating optical system L1B. Then, a deflective reflector FM1 deflects the optical axis AX1 to the optical axis AX2 by 90°. The light is also reflected, and an intermediate image IMG is formed.

The first deflective reflector FM1 is arranged between the first imaging optical system Gr1 and the second imaging optical system Gr2. Preferably, as in the instant embodiment, the first deflective reflector FM1 is arranged between the intermediate image IMG and the reciprocating optical system L1B. In the instant embodiment, the first deflective reflector FM1 uses a flat mirror.

The second imaging optical system Gr2 includes a lens unit L2A having a positive refractive power and a lens unit L2B having a positive refractive power.

The lens unit L2A includes, along the light traveling direction from the side of the first imaging optical system Gr1, a positive lens L211, a positive lens L212, and a positive lens L213. The positive lens L211 has an approximately planoconvex form that has a convex surface oriented toward a side opposite to the intermediate image IMG side. The positive lens L212 has a biconvex form. The positive lens L213 has an approximately planoconvex form that has a convex surface oriented toward the intermediate image IMG.

The lens unit L2B includes a positive lens L214, an aspheric negative lens L215, an aspheric negative lens L216, a negative lens L217, an aspheric positive lens L218, a positive lens L219, a positive lens L220, a positive lens L221, a positive lens L222, an aperture stop 103, a positive lens L223, an aspheric positive lens L224, an aspheric positive lens L225, an aspheric positive lens L226, and a positive lens L227. The positive lens L214 has an approximately planoconvex form that has a convex surface oriented toward a side opposite to the second object 102 side. The aspheric negative lens L215 has an approximately planoconcave form that has a concave surface oriented toward a side opposite to the second object 102 side. The aspheric negative lens L216 has an approximately planoconcave form that has a concave surface oriented toward the second object 102 side. The negative lens L217 has a meniscus form that has a concave surface oriented toward the second object 102 side. The positive lens L218 has a biconvex form. The positive lens L219 has a meniscus form that has a convex surface oriented toward the second object 102 side. The positive lens L220 has a meniscus form that has a convex surface oriented toward the second object 102 side. The positive lens L221 has a meniscus form that has a convex surface oriented toward a side opposite to the second object 102 side. The positive lens L222 has an approximately planoconvex form that has a convex surface oriented toward a side opposite to the second object 102 side. The positive lens L223 has an approximately planoconvex form that has a convex surface oriented toward a side opposite to the second object 102 side. The aspheric positive lens L224 has an approximately planoconvex form that has a convex surface oriented toward a side opposite to the second object 102 side. The aspheric positive lens L225 has a planoconvex form that has a convex surface oriented toward a side opposite to the second object 102 side. The aspheric positive lens L226 has an approximately planoconvex form that has a convex surface oriented toward a side opposite to the second object 102 side. The positive lens L227 has a planoconvex form that has a plane surface oriented toward the second object 102.

A space between the final lens (positive lens L227) and the second object 102 is filled with a fluid (so-called immersion structure).

The second deflective reflector FM2 is arranged between the lens unit L2A and the lens unit L2B of the second imaging optical system Gr2. The present embodiment makes the second deflective reflector FM2 of a plane mirror for deflecting the light reflected from the first deflective reflector FM1 in a predetermined direction.

The aperture stop 103 is arranged between the positive lens L222 and the positive lens L223.

The catadioptric projection optical system 100 of the fifth embodiment uses a projection magnification of ¼, a reference wavelength of 193.0 nm, and quartz as a glass material. An image-side numerical aperture is NA=0.80. An object-image distance (the first object 101 surface to the second object 102 surface) is L=1166.42 mm. An aberration-corrected object point in a range of about 11.25 to 17.00 mm secures a rectangular exposure area of at least 21 mm long and 4 mm wide.

Figure 11:
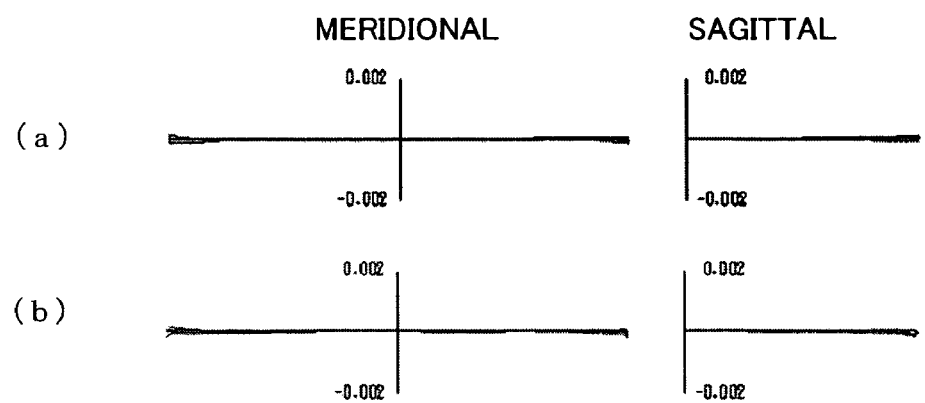
FIG. 11 is an aberrational diagram of the catadioptric projection optical system shown in FIG. 10.

FIG. 11 shows a lateral aberration diagram of the catadioptric projection optical system 100 of the fifth embodiment. FIG. 11 shows a wavelength with a reference wavelength of 193.0 nm±0.2 pm. Understandably, monochrome and chromatic aberrations are satisfactorily corrected. FIG. 11A shows a lateral aberration diagram for light from an off-axis area that has an image point of 11.25 mm in the second object 102. On the other hand, FIG. 11B shows a lateral aberration diagram for light from an off-axis area that has an image point of 17.00 mm in the second object 102.

The following Table 5 shows the specification of the numerical example of the catadioptric projection optical system 100 of the fifth embodiment. Symbols in the table are the same as in table 1, and thus a description thereof will be omitted.

TABLE 5

DISTANCE FROM FIRST OBJECT~FIRST SURFACE: 20.37598 mm

| i | ri | di | LENS MATERIAL |
|---|---|---|---|
| 1 | 203.00558 | 20.22118 | sio2 |
| 2 | 576.42020 | 14.80008 | |
| 3 | −492.33864 | 57.61062 | sio2 |
| 4 | −526.89874 | 112.12301 | |
| 5 | 400.38641 | 33.18363 | sio2 |
| 6 | 201.39136 | 2.79467 | |
| 7 | 177.53838 | 45.87089 | sio2 |
| 8 | 202.59248 | 85.13856 | |
| 9 | −160.17813 | 57.47088 | sio2 |
| 10 | −803.98029 | 21.47386 | |
| 11 | −1171.17073 | 26.20406 | sio2 |
| 12 | −703.25100 | 44.88514 | |
| 13 | −314.40159 | −44.88514 | M1 |
| 14 | −703.25100 | −26.20406 | sio2 |
| 15 | −1171.17073 | −21.47386 | |
| 16 | −803.98029 | −57.47088 | sio2 |
| 17 | −160.17813 | −85.13856 | |
| 18 | 202.59248 | −45.87089 | sio2 |
| 19 | 177.53838 | −2.79467 | |
| 20 | 201.39136 | −33.18363 | sio2 |
| 21 | 400.38641 | −97.99940 | |
| 22 | 0.00000 | 365.16653 | FM1 |
| 23 | −1280.64351 | 40.58289 | sio2 |
| 24 | −379.84384 | 11.58554 | |
| 25 | 1547.35845 | 39.14892 | sio2 |
| 26 | −1431.76874 | 1.00000 | |
| 27 | 574.67919 | 32.54781 | sio2 |
| 28 | 1969.61290 | 250.00000 | |
| 29 | 0.00000 | −180.80702 | FM2 |
| 30 | −300.68406 | −64.71536 | sio2 |
| 31 | −976.37471 | −32.95024 | |
| 32 | 703.10781 | −64.17712 | sio2 |
| 33 | −1053.02053 | −53.71712 | |
| 34 | −1997.89113 | −17.93765 | sio2 |
| 35 | −237.29539 | −16.96307 | |
| 36 | −313.87481 | −57.13426 | sio2 |
| 37 | −260.11951 | −58.07893 | |
| 38 | −600.89121 | −48.56435 | sio2 |
| 39 | 933.94372 | −1.44638 | |
| 40 | 1985.09422 | −36.16253 | sio2 |
| 41 | 819.94206 | −1.34286 | |
| 42 | 1225.43863 | −30.25000 | sio2 |
| 43 | 612.20246 | −1.05175 | |
| 44 | −367.67108 | −30.25000 | sio2 |
| 45 | −453.12488 | −11.50209 | |
| 46 | −576.95966 | −32.31916 | sio2 |
| 47 | −1332.57952 | −14.20687 | |
| 48 | 0.00000 | 5.00000 | APERTURE STOP |
| 49 | −430.84671 | −53.36681 | sio2 |
| 50 | −2851.31825 | −1.06630 | |
| 51 | −236.30209 | −69.58186 | sio2 |
| 52 | −852.44456 | −7.43427 | |
| 53 | −314.08005 | −44.77623 | sio2 |
| 54 | −987.20660 | −1.60092 | |
| 55 | −132.17304 | −44.26445 | sio2 |
| 56 | −369.26131 | −1.00000 | |
| 57 | −108.19410 | −66.62369 | sio2 |
| 58 | 0.00000 | −0.99904 | Water |

$L = 1166.42$ mm
$\beta = ¼$
$NA = 1.20$
$|\beta1/NAO| = 4.01$
$|\beta1 \cdot \beta f/NAO| = 10.51$
$|\beta1| = 1.203$
$a/b = 0.104$
$b/c = 0.577$

| ASPHERICAL SURFACES | | | | |
|---|---|---|---|---|
| i | K | A | B | C |
| 7 | −0.56708348 | −1.31719659E−08 | −1.38388173E−13 | −2.47831946E−17 |
| 10 | −13.33200814 | −9.98967074E−09 | −6.02618482E−16 | −9.03597109E−19 |
| 16 | −13.33200814 | −9.98967074E−09 | −6.02618482E−16 | −9.03597109E−19 |
| 19 | −0.56708348 | −1.31719659E−08 | −1.38388173E−13 | −2.47831946E−17 |
| 33 | −77.72620869 | −2.03919978E−08 | 6.40857136E−14 | −6.89800197E−18 |
| 34 | −2.83174721E+02 | 8.59748788E−09 | −4.12255760E−13 | 7.77740998E−19 |
| 38 | 0.93134956 | 7.07462568E−09 | 1.56091721E−13 | −2.38211794E−18 |
| 51 | −0.16647817 | 1.74765770E−09 | −1.90710275E−14 | 1.10302904E−18 |
| 53 | 0.42251528 | −1.33193559E−08 | 4.51898986E−13 | −1.24500113E−17 |
| 56 | −4.33626161 | −2.90218160E−08 | −3.59874568E−12 | 2.53930041E−16 |
| i | D | E | F | G |
| 7 | −5.00662897E−22 | −4.72939474E−26 | 5.14339140E−30 | −5.84124586E−34 |
| 10 | −5.31852156E−23 | −6.85075303E−28 | 1.03915994E−31 | −2.53424475E−36 |
| 16 | −5.31852156E−23 | −6.85075303E−28 | 1.03915994E−31 | −2.53424475E−36 |
| 19 | −5.00662897E−22 | −4.72939474E−26 | 5.14339140E−30 | −5.84124586E−34 |
| 33 | 2.87151959E−22 | −1.54013967E−26 | 4.08972948E−31 | −4.56093909E−36 |
| 34 | 1.09134502E−22 | −1.56040402E−26 | 4.87756567E−31 | −5.08642891E−36 |
| 38 | 4.34686480E−23 | 4.31971356E−27 | −1.83352981E−31 | 3.33797362E−36 |
| 51 | 3.72407626E−23 | −1.05704225E−27 | −2.90604508E−32 | 7.35125593E−37 |
| 53 | 1.91257401E−22 | −8.53376614E−27 | 7.37781006E−31 | −1.36248923E−35 |
| 56 | −2.38856441E−20 | 7.39620837E−25 | 3.38342785E−29 | −4.02935536E−33 |

The catadioptric projection optical system of the present invention reduces the incident angle and the incident angle range of light upon the deflective reflectors (optical path deflective mirror)and can easily control reflection film properties. Moreover, the catadioptric projection optical system of the present invention can obtain a large enough imaging area width with no light shielding at the pupil, and stably achieve the superior imaging performance. Especially, the influence to the imaging performance by reflection film properties that raises a problem at higher NA can be controlled. Moreover, the catadioptric projection optical system of the present invention avoids the interference between the light and the lens, reduces the incident angle range on the plane mirror, thus, achieves easiness of the control of reflection film properties. Additionally, the catadioptric projection optical system of the present invention controls the generation of chromatic coma aberration.

Figure 12:
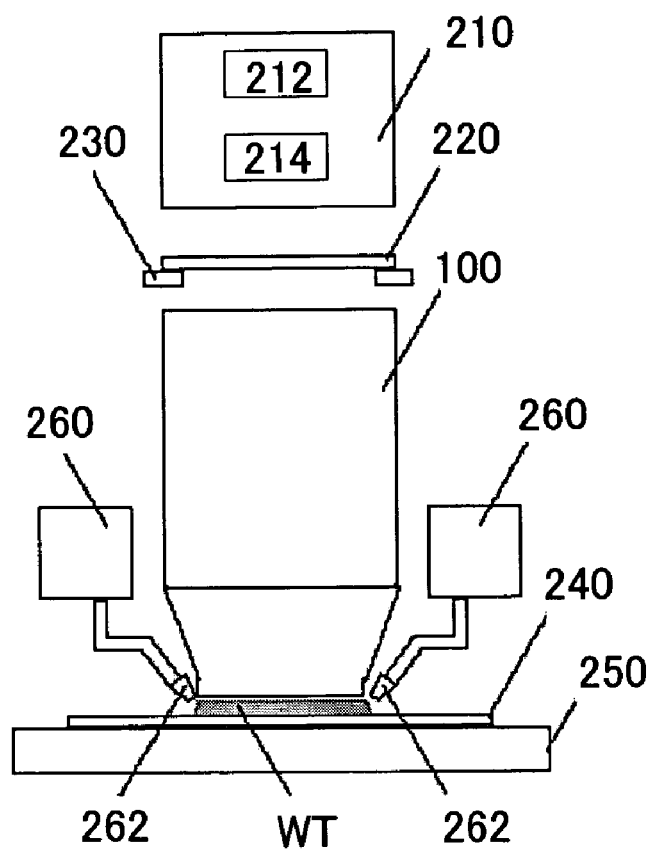
FIG. 12 is a schematic sectional view of an exposure apparatus of one aspect according to the present invention.

Referring now to FIG. 12, a description will be given of an exposure apparatus 200 to which the catadioptric projection optical system 100 of the present invention is applied. FIG. 12 is a schematic sectional view of an exposure apparatus 200 of one aspect according to the present invention.

The exposure apparatus 200 is an immersion type exposure apparatus that exposes onto an object 240 a circuit pattern of a reticle 220 via a fluid WT supplied between a final lens surface at the object 240 side of a projection optical system 100 and the object 240 in a step-and-scan manner or step-and-repeat manner. Such an exposure apparatus is suitable for a sub-micron or quarter-micron lithography process. The instant embodiment exemplarily describes a step-and-scan exposure apparatus (which is also called "scanner"). "The step-and-scan manner", as is used herein, is an exposure method that exposes a reticle pattern onto a wafer by continuously scanning the wafer relative to the reticle, and by moving, after a shot of exposure, the wafer stepwise to the next exposure area to be shot. "The step-and-repeat manner" is another mode of exposure method that moves a wafer stepwise to an exposure area for the next shot every short of cell projection.

The exposure apparatus 200 includes, as shown in FIG. 12, an illumination apparatus 210, a reticle stage 230, the catadioptric projection optical system 100, a wafer stage 250, a fluid supply-recovery mechanism 260, and a controller (not shown). The controller (not shown) can control and connects with the illumination apparatus 210, the reticle stage 230, the wafer stage 250, and the fluid supply-recovery mechanism 260.

The illumination apparatus 210 illuminates the reticle 220 that forms the circuit pattern to be transferred, and includes a light source unit 212 and the illumination optical system 214.

The light source unit 212, as an example, uses a light source such as ArF excimer laser with a wavelength of approximately 193 [nm] and KrF excimer laser with a wavelength of approximately 248 [nm]. However, the laser type is not limited to excimer lasers because for example, $F_2$ laser with a wavelength of approximately 157 [nm] and a YAG laser may be used. Similarly, the number of laser units is not limited. For example, two independently acting solid lasers would cause no coherence between these solid lasers and significantly reduces speckles resulting from the coherence. An optical system for reducing speckles may swing linearly or rotationally. A light source applicable for the light source unit 212 is not limited to a laser, and may use one or more lamps such as a mercury lamp and a xenon lamp.

The illumination optical system 214 is an optical system that illuminates the reticle 220, and includes a lens, a mirror, an optical integrator, a stop, and the like, for example, a condenser lens, an optical integrator, an aperture stop, a condenser lens, a slit, and an image-forming optical system in this order. The illumination optical system 214 can use any light regardless of whether it is on-axial or off-axial light. The optical integrator may include a fly-eye lens or an integrator formed by stacking two sets of cylindrical lens array plates (or lenticular lenses), and be replaced with an optical rod or a diffractive element.

The reticle 220 is, for example, reflection or penetration reticle, and forms the circuit pattern to be transferred. The reticle 220 is supported and driven by the reticle stage 230.

Diffracted light emitted from the reticle 220 passes the catadioptric projection optical system 230 and is then projected onto the plate 540. The reticle 220 and the object 240 are located in an optically conjugate relationship. Since the exposure apparatus 200 of the instant embodiment is a scanner, the reticle 220 and the object 240 are scanned at the speed of the reduction ratio. Thus, the pattern on the reticle 220 is transferred to the object 240. If it is a step-and-repeat exposure apparatus (referred to as a "stepper"), the reticle 220 and the object 240 remain still in exposing the reticle pattern.

The reticle stage 230 supports the reticle 220 via a reticle chuck (not shown), and is connected to a moving mechanism (not shown). The moving mechanism includes a linear motor, etc., and moves the reticle 220 by driving the reticle stage 230 at least in a direction X. The exposure apparatus 200 scans the reticle 220 and the object 240 synchronously by the controller (not shown). Here, X is a scan direction on the reticle 220 or the object 240, Y is a direction perpendicular to it, and Z is a perpendicular direction to the surface of reticle 220 or the object 240.

The catadioptric projection optical system 100 is a catadioptric projection optical system that projects the pattern on the reticle 220 onto the image surface. The catadioptric projection optical system 100 can apply any embodiments as above-mentioned, and a detailed description will be omitted.

The object 240 is, in the instant embodiment, a wafer, which includes a glass plate for the liquid crystal substrate and other objects. Photoresist is applied to the object 240.

The wafer stage 250 supports the object 240 via a wafer chuck (not shown). The wafer stage 250 moves the object 250 in X-Y-Z directions by using a linear motor similar to the reticle stage 230. The positions of the reticle stage 230 and wafer stage 250 are monitored, for example, by a laser interferometer and the like, so that both are driven at a constant speed ratio. The wafer stage 250 is installed on a stage stool supported on the floor and the like, for example, via a dumper, and the reticle stage 230 and the catadioptric projection optical system 100 are installed on a lens barrel stool (not shown) supported, for example, via a dumper to the base frame placed on the floor.

The fluid supply-recovery mechanism 260 supplies the fluid WT between the catadioptric projection optical system 100 and the object 240, which in detail means between the final lens surface at the object 240 side of the catadioptric projection optical system 100 (optical element arranged on the object 240 side final edge of the catadioptric projection optical system 100) and recovers the supplied fluid WT. In other words, the space formed on the catadioptric projection optical system 100 and the surface of the object 240 is filled with the fluid WT supplied from the fluid supply-recovery mechanism 260. The fluid WT is, in the instant embodiment, pure water. However, the fluid WT is not limited to pure water, can use a fluid that has high transmittance property and refractive index property for a wavelength of the exposure light, and high chemical stability to the catadioptric projection optical system 100 and the photoresist spread on the object 240. For example, fluorine system inert fluid may be used.

The controller (not shown) includes a CPU and memory (not shown) and controls operation of the exposure apparatus 200. The controller is electrically connected to the illumination apparatus 210, (the moving mechanism (not shown) for) the reticle stage 230, (the moving mechanism (not shown) for) the wafer stage 250, and the fluid supply-recovery mechanism 260. The controller controls the supply and recover of the fluid WT, switch of stop, and supply and recover amount of the fluid WT based on a condition such as a drive direction of the wafer stage 250 during the exposure. The CPU includes a processor regardless of its name, such as an MPU, and controls each module. The memory includes a ROM and RAM, and stores a firmware for controlling the operations of the exposure apparatus 200.

In exposure, light is emitted from the light source unit 212, e.g., Koehler-illuminated the reticle 220 via the illumination optical system 214. Light that passes through the reticle 220 and reflects the reticle pattern is imaged onto the object 240 by the catadioptric projection optical system 100. The catadioptric projection optical system 100 used for the exposure apparatus 200 has a superior imaging performance, and can provide devices, such as semiconductor chips, such as LSIs and VLSIs, CCDs, LCDs, magnetic sensors, and thin-film magnetic heads, with high throughput and economic efficiency.

Figure 13:
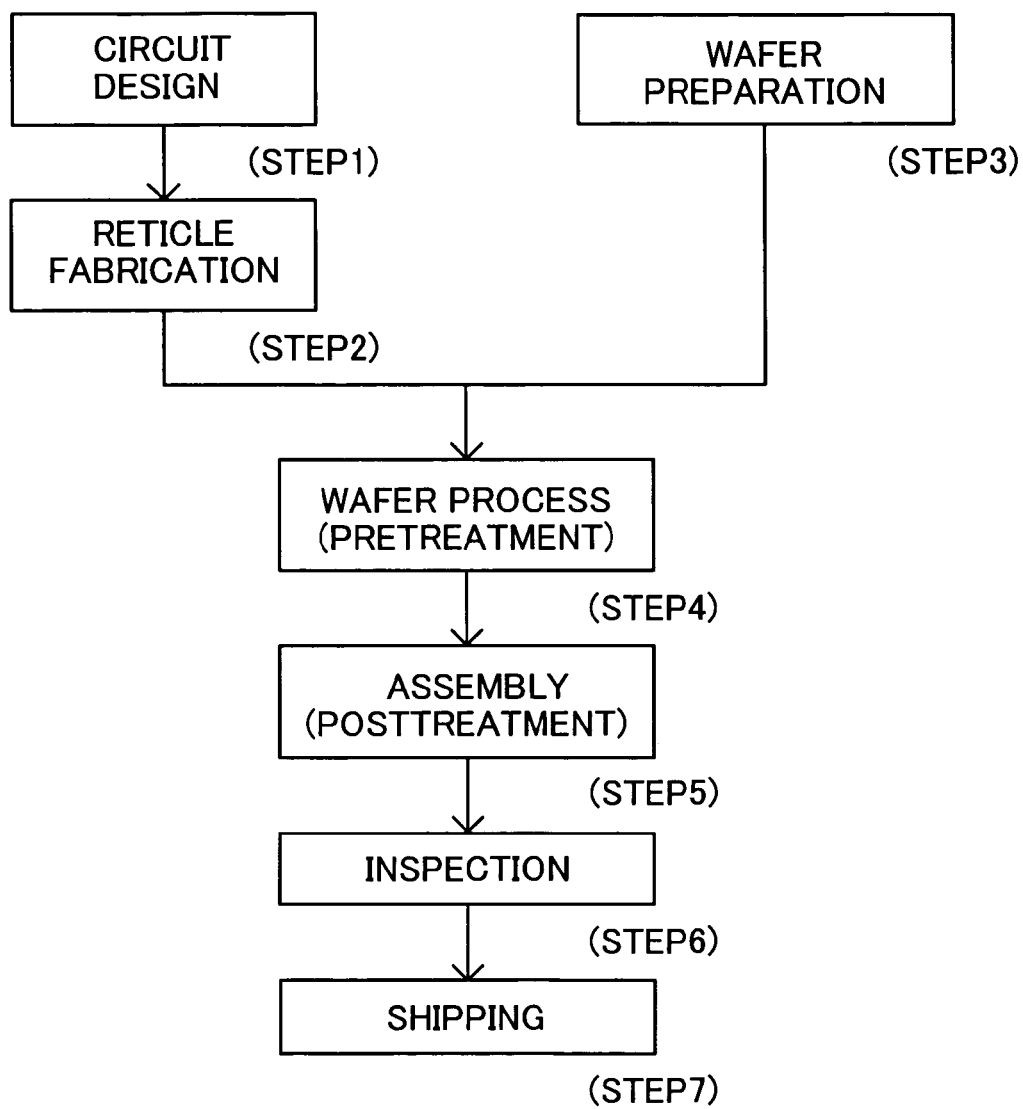
FIG. 13 is a flowchart for explaining how to fabricate devices.
Figure 14:
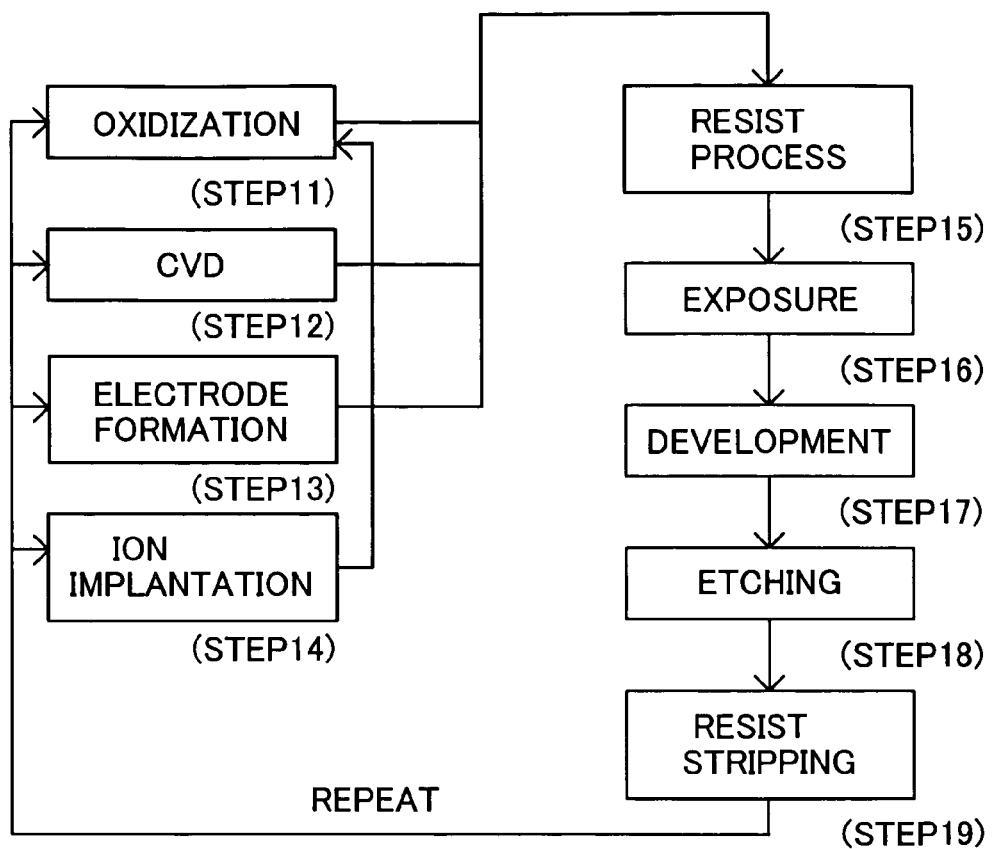
FIG. 14 is a detailed flowchart of a wafer process in Step 4 of FIG. 13.

Referring now to FIGS. 13 and 14, a description will be given of an embodiment of a device fabrication method using the above mentioned exposure apparatus 200. FIG. 13 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer making) manufactures a wafer using materials such as silicon. Step 4 (wafer process), which is also referred to as a pretreatment, forms the actual circuitry on the wafer through lithography using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 14 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 200 to expose a circuit pattern from the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 200, and resultant devices constitute one aspect of the present invention.

Furthermore, the present invention is not limited to these preferred embodiments and various variations and modifications may be made without departing from the scope of the present invention. For example, the present invention can be applied to an exposure apparatus other than the immersion exposure apparatus.

This application claims a foreign priority benefit based on Japanese Patent Application No. 2004-309129, filed on Oct. 25, 2004, which is hereby incorporated by reference herein in its entirety as if fully set forth herein.

What is claimed is:

1. A catadioptric optical system comprising:

a first imaging optical system including a concave mirror and forming an intermediate image of a first object, said first imaging optical system forming a reciprocating optical system that an incidence light and reflected light pass;

a second imaging optical system for forming an image of the intermediate image onto a second object;

a first optical path deflective member, provided between the concave mirror and the intermediate image, for introducing a light from the first imaging optical system to the second imaging optical system;

a second optical path deflective member provided between the intermediate image and the second object;

a lens unit, provided between the intermediate image and the second optical path deflective member, wherein said first optical path deflective member deflects a light in such a direction that a forward path of the first imaging optical system intersects a return path of the first imaging optical system, wherein said intermediate image is formed without an optical element after a deflection, and wherein $6.80<|\beta 1 \cdot \beta f/NAO|<10.60$, is met, where $\beta 1$ is a paraxial imaging magnification of the first imaging optical system, NAO is a numerical aperture of the light at the first object side, and $\beta f$ is a paraxial imaging magnification of the lens unit.

2. A catadioptric projection optical system according to claim 1, wherein $0.0005<a/b<0.105$, is met, where a is a distance parallel to an optical axis between the intermediate image and a first surface of an optical element closest to the intermediate image among the lens unit, and b is a distance along the optical axis for the light from the intermediate image to the second object via the second imaging optical system.

3. A catadioptric projection optical system according to claim 2, wherein $0.47<b/c<0.58$, is met, where c is a distance along the optical axis for the light from the first surface to the second object via the first imaging optical system and the second imaging optical system.

4. A catadioptric projection optical system according to claim 1, wherein a sign of an angle of a pupil paraxial ray inverts at before or after the lens unit.

5. A device fabrication method comprising the steps of:

exposing an object using an exposure apparatus according to claim 1; and performing a development process for the object exposed.

* * * * *